United States Patent [19]
Kuno et al.

[11] Patent Number: 5,641,264
[45] Date of Patent: Jun. 24, 1997

[54] SUBSTRATE CONVEYING DEVICE AND METHOD OF CONTROLLING THE SAME

[75] Inventors: Mitsutoshi Kuno, Sagamihara; Hidehiko Fujioka; Nobutoshi Mizusawa, both of Yamato; Yuji Chiba, Isehara; Takao Kariya, Hino; Koji Uda, Yokohama; Shunichi Uzawa, Tokyo; Eigo Kawakami, Ebina, all of Japan

[73] Assignee: Canon Kabushiki Kaisha, Tokyo, Japan

[21] Appl. No.: 996,870

[22] Filed: Dec. 21, 1992

Related U.S. Application Data

[63] Continuation of Ser. No. 681,056, Apr. 5, 1991, abandoned.

[30] Foreign Application Priority Data

| Apr. 6, 1990 | [JP] | Japan | 2-90413 |
| Jun. 1, 1990 | [JP] | Japan | 2-141565 |
| Jul. 3, 1990 | [JP] | Japan | 2-174441 |

[51] Int. Cl.$^6$ ............................. B65G 65/00
[52] U.S. Cl. ............ 414/751; 198/464.1; 294/907; 414/786
[58] Field of Search ............ 414/751, 754, 414/757, 331, 416, 783, 786; 901/34, 9; 198/464.2; 294/907; 134/902; 318/568.12, 568.16, 568.17, 568.21; 364/513; 395/93, 95, 90

[56] References Cited

U.S. PATENT DOCUMENTS

| 3,906,325 | 9/1975 | Salmon | 901/34 X |
| 4,132,318 | 1/1979 | Wang et al. | 901/34 X |
| 4,510,683 | 4/1985 | Fedde | 901/9 X |
| 4,514,616 | 4/1985 | Warner | 901/49 X |
| 4,540,331 | 9/1985 | Stanner et al. | 901/49 X |
| 4,561,688 | 12/1985 | Tsutsui | 294/64.1 |
| 4,715,774 | 12/1987 | Magnuson | 414/751 |
| 4,846,626 | 7/1989 | Engelbrecht et al. | 414/752 X |
| 4,955,654 | 9/1990 | Tsuchihashi et al. | 901/34 X |
| 4,999,506 | 3/1991 | Mizusawa et al. | 250/491.1 |
| 5,026,239 | 6/1991 | Chiba et al. | 414/217 |

FOREIGN PATENT DOCUMENTS

| 0198501 | 10/1986 | European Pat. Off. |
| 59-46030 | 3/1984 | Japan |

*Primary Examiner*—Donald W. Underwood
*Attorney, Agent, or Firm*—Fitzpatrick, Cella, Harper & Scinto

[57] ABSTRACT

A method of controlling a conveying device having a gripping hand for gripping an article to be conveyed and a conveying mechanism for conveying the gripping hand, wherein a pressing force applied to the gripping hand through the article being conveyed is detected and the conveying operation of the conveying mechanism is stopped when the pressing force exceeds a predetermined force.

11 Claims, 20 Drawing Sheets

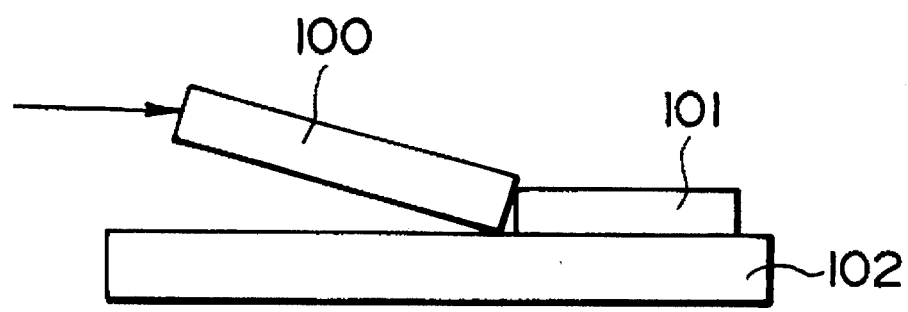
FIG. IA
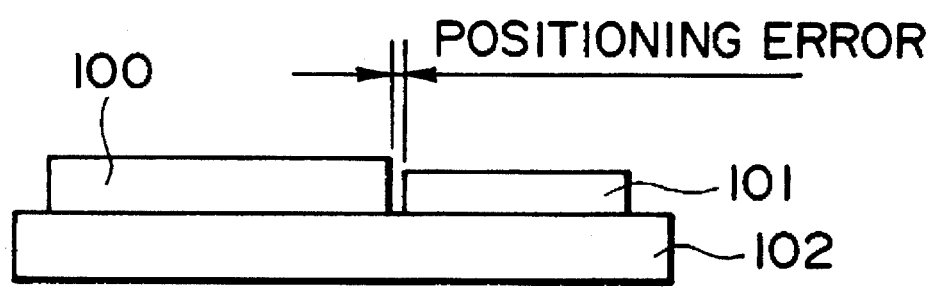
FIG. IB

FIG. II

- F : ABUTTING FORCE
- W : MASK FRAME WEIGHT
- f : FRICTION FORCE
- 2θ : OPENING ANGLE OF V-BLOCK
- P1, P2 : FORCE APPLIED TO V-BLOCK

SUBSTRATE CONVEYING DEVICE AND METHOD OF CONTROLLING THE SAME

This application is a continuation of prior application Ser. No. 07/681,056 filed Apr. 5, 1991, now abandoned.

FIELD OF THE INVENTION AND RELATED ART

This invention relates to a semiconductor device manufacturing apparatus such as an exposure apparatus usable in the manufacture of semiconductor devices, for forming fine patterns on a semiconductor wafer. More particularly, the invention is concerned with a substrate conveying device and a method of controlling the same, usable in such a semiconductor device manufacturing apparatus, for conveying a substrate such as a mask, for example.

In the field of manufacture of semiconductor devices, a mask conveying device is known wherein a mask having a pattern to be printed on a semiconductor wafer is conveyed onto a mask stage and, by pressing the mask against reference means such as a V-shaped block provided on the mask stage, the mask is positioned correctly. As for such a mask conveying device, there are several types, one of which is that a mask is conveyed while being placed upright, parallel to a vertical plane. Another is that a mask is conveyed while being laid horizontally.

Japanese Laid-Open Patent Application No. 59-046030 shows an arrangement wherein a mask is attracted to a mask chuck until the temperature of the mask becomes substantially equal to the mask chuck temperature and, after that, the attraction of the mask chuck to the mask is once released and, then, the mask is attracted again by the mask chuck.

SUMMARY OF THE INVENTION

It is an object of the present invention to provide an improved substrate conveying device for conveying a substrate such as a mask, for example.

It is another object of the present invention to provide a method of controlling such a substrate conveying device.

It is a further object of the present invention to provide a conveying device and a method of controlling the same, which is usable in a semiconductor device manufacturing apparatus and by which a mask having a pattern to be transferred onto a semiconductor wafer can be conveyed and positioned with high precision.

It is yet a further object of the present invention to provide a conveying device and a method of controlling the same, by which, for the positioning of a mask upon a mask stage, undesirable distortion of a pattern formed on the mask can be minimized.

It is still another object of the present invention to provide a conveying device and a method of controlling the same, by which, even if a mask conveyed to a mask stage is tilted with respect to the mask stage, high-precision positioning of the mask is attainable by using a reference means such as a V-shaped block.

For example, as shown in FIG. 1A, if a mask 100 conveyed to a mask stage 102 is tilted and, in this state, it is pressed against a V-shaped block 101 and then is attracted to the mask stage, then the attracted mask 100 is spaced away from the V-shaped block 101. This results in failure of high-precision positioning. In one aspect, the present invention aims to solve such an inconvenience.

It is yet a further object of the present invention to provide a conveying device and a method of controlling the same, by which, for the positioning of a mask upon a mask stage, the mask can be pressed against a reference means such as a V-shaped block, with a constant pressing force stably.

It is still another object of the present invention to provide an improved conveying device for moving a substrate such as a mask to a mask stage through a motor drive, as well as a method of controlling such a conveying device.

It is yet another object of the present invention to provide a conveying device and a method of controlling the same, by which, even if collision of a substrate such as a mask occurs during the conveyance, the operation of the substrate conveying device can be stopped quickly to minimize the possibility of damage to the substrate and/or the conveying device.

It is yet another object of the present invention to provide a conveying device and a method of controlling the same, by which undesirable production of dust or foreign particles at the positioning of a mask, using a reference means such as a V-shaped block, can be minimized.

It is yet another object of the present invention to provide a conveying device and a method of controlling the same, by which, for the positioning of a mask upon a mask stage, undesirable distortion of a pattern formed on the mask is minimized to assure high-precision printing of the mask pattern upon a semiconductor wafer.

It is yet another object of the present invention to provide a conveying device and a method of controlling the same, by which, when a mask is to be held by a mask stage with the mask placed vertically, the mask can be positioned accurately by using a reference means such as a V-shaped block.

In accordance with an aspect of the present invention, there is provided a positioning method for a mask conveying device having a mask hand for gripping a mask and a conveying means for conveying the mask to a mask stage, the conveying means having a reference means for the positioning of the mask with respect to a mask chuck adapted to hold the mask by attraction, the mask being pressed against the reference means on the mask stage whereby it is positioned, wherein the method includes: a first attracting step for holding, by attraction, the mask through the mask chuck as the mask is conveyed onto the mask stage; a releasing step for releasing the attraction by the mask chuck after the mask, being held by attraction through the mask chuck in the first attracting step, is gripped by the mask hand; a positioning step for pressing the mask, gripped by the mask hand in the releasing step, against the reference means through a drive of the conveying means, and detecting the pressing force applied to the mask hand through the mask and stopping the drive of the conveying means when the detected pressing force reaches a predetermined set pressing force; and a second attracting step for holding by attraction the mask through the mask chuck after the operation of the conveying means is stopped in the positioning step.

The mask hand may grip the mask in an upright state, and the mask chuck of the mask stage may hold by attraction the mask in an upright state.

A strain gauge may be used to detect the pressing force applied to the mask hand through the mask.

A piezoelectric type pressure transducer may be used to detect the pressing force applied to the mask hand through the mask.

In the present invention, the mask conveyed by the conveying means is once held by the mask chuck of the mask stage with attraction, so that the attitude of the mask is corrected to follow the mask chuck surface of the mask stage. After this, in that state, the attraction of the mask chuck is released. Thus, the mask can be pressed against the positioning reference means on the mask stage while being held parallel to the mask chuck. Therefore, the mask can be accurately positioned along the mask chuck surface of the mask stage. Further, when the mask is pressed against the reference means, the pressing force applied to the mask hand through the mask is detected, the detected pressing force reaches a predetermined set pressing force, the pressing of the mask to the reference means is stopped. This prevents an unnecessarily large pressing force from being applied to the mask for the positioning.

In accordance with another aspect of the present invention, there is provided a method of controlling a conveying device having a gripping means for gripping an article to be conveyed and a conveying means having the gripping means mounted thereon, for conveying the article through a predetermined stroke, wherein the pressing force applied to the gripping means through the article is detected and, when the pressing force is greater than a predetermined force, the conveying operation by the conveying means is stopped.

A strain gauge may be used to detect the pressing force of the article applied to the gripping means through the article. Alternatively, a piezoelectric type pressure transducer may be used to detect the pressing force of the article applied to the gripping means through the article.

In the present invention, the conveying operation of the conveying means is executed while monitoring the pressing force applied to the gripping means through the article and, if the pressing force becomes greater than a predetermined force, the operation of the conveying means is stopped. Thus, even if collision occurs during the conveyance, it is possible to prevent damage to the article or the conveying device itself.

In accordance with a further aspect of the present invention, there is provided a positioning method for a mask, by pressing the mask against a V-shaped block for the positioning thereof with respect to X and Y directions and by rotating the mask for the positioning with respect to the θ direction, wherein the method includes: (a) a step for pressing the mask against the V-shaped block with a first pressing force so as to press-contact the mask to two surfaces of the V-shaped block; (b) a step for urging the mask in a direction away from the V-shaped block so as to reduce the pressing force to the V-shaped block to a second pressing force lower than the first pressing force; (c) a step for rotating the mask under the application of the second pressing force; (d) a step for pressing the mask against the V-shaped block with the first pressing force, again; (e) a step for urging the mask in a direction away from the V-shaped block, so that the pressing force to the V-shaped block decreases to a third pressing force lower than the first pressing force; and (f) a step for fixedly holding the mask under the application of the third pressing force.

Preferably, the first to third pressing forces may be detected by a sensor, provided at the pressing means side of the mask, to execute feedback control.

Alternatively, the first to third pressing forces may preferably be controlled on the basis of a drive quantity of a mask conveying actuator which is predetermined in relation to the quantity of mask strain.

The mask (mask frame) is once pressed so that it is press-contacted, with certainty, to two surfaces of the V-shaped block, by which the positioning thereof with respect to the X and Y directions is accomplished. The rotation in the θ direction is effected, with the pressing force being decreased to substantially zero or a level near it. After the θ direction positioning, the mask is again press-contacted to the V-shaped block. Thereafter, while the press-contact force is decreased, the mask is fixedly held by attraction or the like.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B are schematic views, respectively, for explaining the positioning of a mask.

DESCRIPTION OF THE PREFERRED EMBODIMENTS

Figure 2:
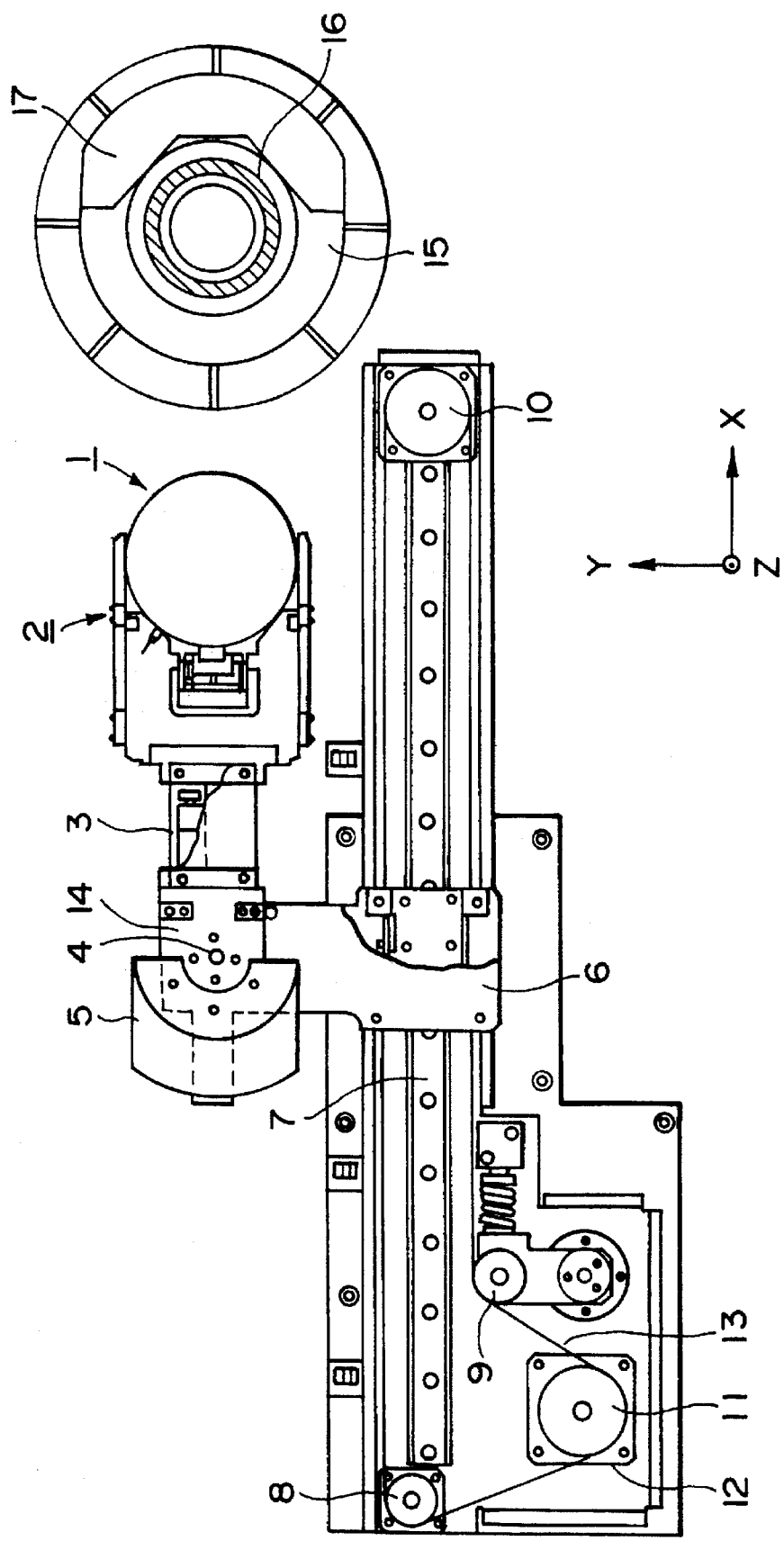
FIG. 2 is a view of a mask conveying device according to an embodiment of the present invention.

FIG. 2 shows a mask conveying device for use in an X-ray exposure apparatus, for embodying a conveying device control method of the present invention.

In this mask conveying device, a traverse unit 6 engages a linear guide 7, mounted on a stationary base of an X-ray exposure apparatus (not shown). The traverse unit 6 can be moved in the X direction by a drive of a DC motor 12 which is transmitted through a flat belt 13 stretched around pulleys 8, 9, 10 and 11. At a longitudinal end of the traverse unit 6, a central portion of a base 14 is supported by a pin 4, projecting in the Z direction, rotatably about the pin ($\omega$Z direction). To an end of the base 14, a mask hand 2 is mounted. The mask hand 2 serves to grip a mask (article to be conveyed) 1 through an arm unit 3 which has a motor (not shown) disposed therewithin and which is displaceable in the Z direction. Balancer 5 is mounted to another end of the base 14.

Figure 3:
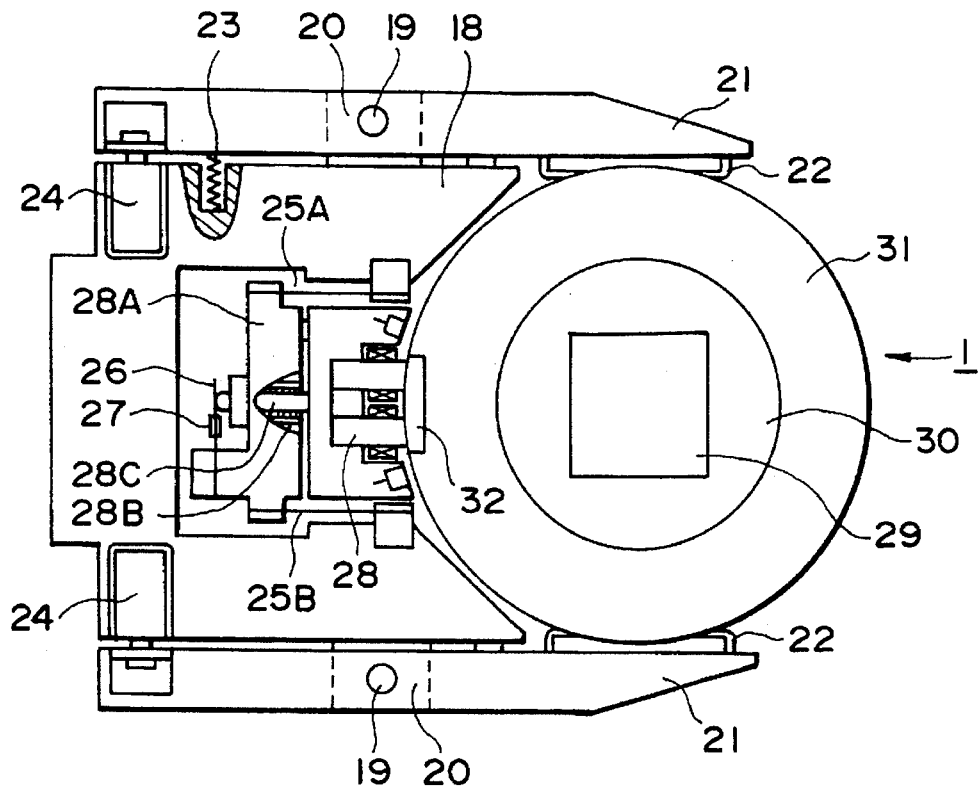
FIG. 3 shows details of a mask hand of the mask conveying device of FIG. 2.

Referring to FIG. 3, details of the mask hand 2 will be explained.

The mask hand 2 has a hand main body 18 which is configured into a generally channel shape as viewed from above. Provided at the opposite sides of the hand main body 18 are supports 20 which project in a direction parallel to the surface of the mask 1 as gripped. Each support 20 has a projecting pin 19 by which a substantially central portion of a finger 21 is rotatably supported. The finger 21 has a pawl 22 mounted to an end thereof, for gripping the mask 1. At the other end of the finger, there are provided a compressed spring 23 and a solenoid 24 which are disposed between the hand main body 18 and the finger. The compressed spring 23 serves to normally urge the end of the finger 21, having the pawl 22, in a closing direction. The solenoid 24 serves to move that end portion of the finger 21 in an opening direction against the spring force of the compressed spring 23. By the actuation of two solenoids 24, two fingers 21 of the mask hand 2 are opened and closed. Disposed in the inside space of the hand main body 18 is a magnet supporting member 28A which supports a center attracting means (hand magnet) 28 for magnetically attracting the mask 1. The magnet supporting member 28A is flexibly mounted to the hand main body 18 by means of two parallel springs 25A and 25B. A bearing bore 28B is formed in the central portion of the magnet supporting member 28A. In this bearing bore 28B, a supporting rod 28C provided integrally with the center attracting means 28 is supported through a roll bearing means, axially movably. Thus, the supporting rod 28C is movable through a predetermined minute distance. Further, the supporting rod 28C projects outwardly of the opposite side of the magnet supporting member 28A, remote from the attracting means. The tip end of the supporting rod 28C engages with a free end portion of a leaf spring 26 which extends upright from the magnet supporting member 28A, whereby the center attracting means 28 is normally urged toward the mask 1 as gripped.

With this structure, when the mask 1 gripped by the mask hand 2 is conveyed onto a mask stage 15 (to be described later) and when it is engaged by a V-shaped block 17 (which is a reference means provided on the mask stage 15 for the positioning of the mask with respect to the mask stage 15) or it is engaged by any other obstacle, the center attracting means 28 receives a force and is moved in a direction away from the mask, such that the free end of the supporting rod 28c of the center attracting means 28 presses the leaf spring 26 to cause flexure of the same. The flexure of the leaf spring 26 can be detected by a strain gauge 27, adhered to the leaf spring 26, whereby the pressing force can be detected.

On the other hand, the mask 1 comprises a mask membrane 30 having a mask pattern 29 formed thereon and a mask frame 21 having a magnetizable material 32 attached to a side and a bottom thereof. The magnetizable material 32 can be magnetically attracted to the center attracting means 28.

Figure 4:
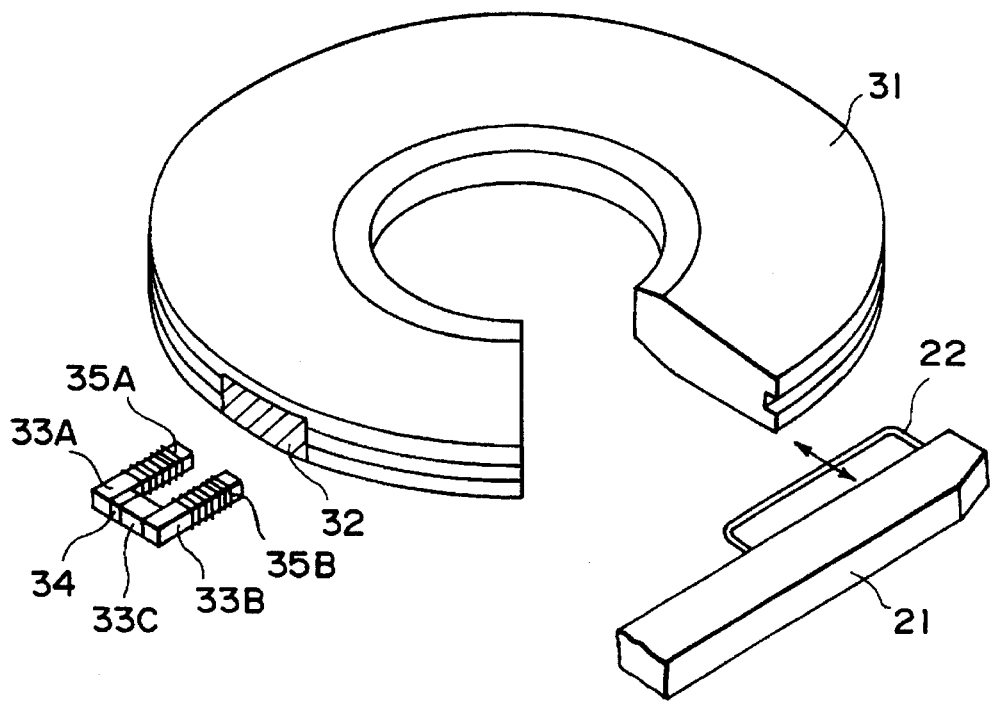
FIG. 4 shows details of a center attracting portion mounted to the mask hand of FIG. 3.

As best seen in FIG. 4, the center attracting means 28 of the mask hand 2 comprises a permanent magnet 34 and three yokes 33A, 33B and 33C. Each of the yokes 33A and 33B has an exciting coil 35A or 35B, wound around the yoke. These exciting coils 35A and 35B serves to produce, when energized, magnetic lines of force effective to cancel the magnetic lines of force produced by the permanent magnet 34.

As the magnetizable material 32 of the mask frame 31 comes close to the center attracting means 28, a closed magnetic circuit is formed by means of the permanent magnet 34, the magnetizable material 32 of the mask frame 31 and the yokes 33A–33C, whereby the attraction is attained. If the attraction of the mask 1 by the center attracting means 28 is to be released, the exciting coils 35A and 35B are energized. In response, a magnetic force is produced in a direction cancelling the magnetic lines of force of the permanent magnet 34, whereby the attraction is released and the mask 1 can be disengaged from the center attracting means 28.

In the above-described mask conveying device, the mask hand 2 grips the mask 1 while the traverse unit 6 moves along the linear guide 7, so as to execute the positioning and holding of the mask 1 upon the mask stage 15 which is equipped with a mask chuck 16 for magnetically attracting the mask 1 and a V-shaped block 17 which is a reference means to be used for the positioning of the mask frame 31.

Figure 5:
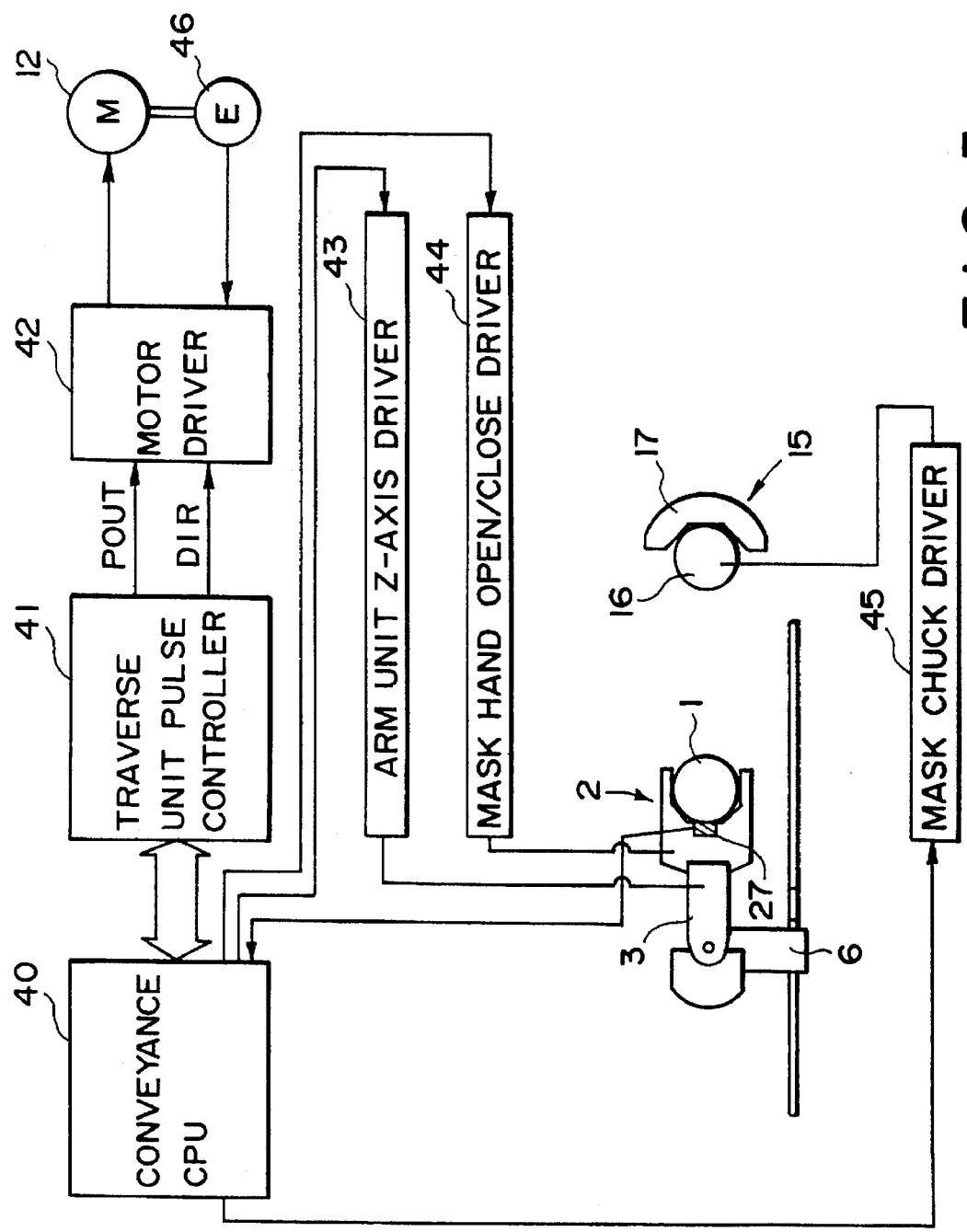
FIG. 5 is a block diagram of an exemplary conveyance control system of the mask conveying device of FIG. 2.

Referring now to FIG. 5, a conveyance control system for controlling the conveying operation of the mask conveying device will be explained.

The conveyance control system of this embodiment includes a conveyance CPU (central processing unit) 40, a traverse unit pulse controller 41 for producing a pulse train (POUT) and a rotational direction signal DIR necessary for rotation of a DC motor 12, a motor driver 42 for driving the DC motor 12 in response to the rotational direction signal DIR and the pulse train POUT, an arm unit Z-axis driver 43, a mask hand opening/closing driver 44, a mask chuck driver 45, and an encoder 46 for monitoring the quantity of rotation of the DC motor 12.

The conveyance CPU 40 serves to control the mask conveying operation as a whole, and is adapted to supply to the traverse unit pulse controller 41 the control data designating the direction and quantity of movement of the traverse unit 6, namely, the direction and quantity of rotation of the DC motor 12. Also, when a mask 1 is to be taken out of a mask cassette (not shown) or when it is to be transferred to the mask stage 15, the conveyance CPU serves to actuate the solenoid 24 of the mask hand 2 through the mask hand opening/closing driver 44 thereby to execute the opening/closing motion of the mask hand 2. Further, when a mask 1 is to be transferred to the mask stage 15, it serves to actuate the arm unit 3 through the arm unit Z-axis driver 43 to cause minute displacement of the mask hand 2 in the Z direction (see FIG. 1) and, additionally, it operates through a mask chuck driver 45 to bring the mask chuck 16 of the mask stage 15 into an attracting state or a non-attracting state.

The conveyance CPU 40 monitors the pressing force as detected by the strain gauge 27 mounted to the mask hand 2. Particularly, as the mask 1 gripped by the mask hand 2 is brought by conveyance to the mask stage 15 and into engagement with the V-shaped block 17 and when the pressing force applied to the strain gauge 17 reaches a level within a predetermined set range of pressing force, the conveyance CPU supplies to the traverse unit pulse controller 41 the control data designating stoppage of the rotation of DC motor 12. The DC motor 12 communicates with the encoder 46, such that with the encoder 46 the quantity of rotation of the DC motor 12 is fed back to the motor driver 42.

Referring now to the flow chart of FIG. 6, the operation of this embodiment will be explained.

First, a mask 1 is taken out of a mask cassette (not shown) by the mask hand 2 and, then, the mask is rotated by 180 degrees by means of a rotating mechanism of the base 14 having the arm unit 3 mounted thereto, so that the mask is aligned with respect to the direction of impingement against the V-shaped block 17 on the mask stage 15. Then, in this state, the traverse unit 6 is moved toward the mask stage 15 (step 51). At this time, the surface of the mask 1 gripped by the mask hand 2 is not coplanar with the surface of the mask chuck 16 of the mask stage 15, but the mask 1 is located above the mask chuck 16 surface with respect to the Z-axis direction (the direction perpendicular to the sheet of the drawing). Just before the mask 1 engages the V-shaped block 17, the movement of the traverse unit 6 is stopped. Then, the mask chuck 16 is brought into a non-attracting state (step 52) and, after this, the arm unit 3 is moved downwardly along the Z axis (step 53) to bring the mask 1 into contact with the mask chuck 16. Then, the mask chuck 16 is brought into the attracting state (step 54), and the mask hand 2 releases the mask 1 (step 55).

In this state, the mask is attracted to and held by the mask chuck 16, such that it follows the mask stage surface. However, there is a possibility that the mask 1 as taken out of the mask cassette and gripped by the mask hand 2 is not at a fixed position within the mask hand 2 and is held with inclination such as illustrated in FIG. 1A. If in such a state, the mask 1 is positioned by pressing the same against the V-shaped block 17 on the mask stage 15 and is attracted to the mask chuck 16, then there is caused a positioning error (gap) between the V-shaped block and the mask 1 as illustrated in FIG. 1B.

In the present embodiment, to avoid such a positioning error, at step 55 as described the attitude of the mask 1 is corrected by attracting and holding the mask 1 to and by the mask chuck 16.

Subsequently, the mask 1 attracted to and held by the mask chuck 16 at step 55 is re-gripped by the mask hand 2 (step 56), and the mask chuck 16 is brought into the non-attracting state (step 57). At this time, the mask 1 is in an open state with respect to the mask stage 15, and the mask 1 is at a fixed position within the mask hand 2, namely, the mask surface is parallel to the mask stage surface. In this state, the traverse unit 6 is moved toward the mask stage 15 (step 58), whereby the mask 1 gripped by the mask hand 2 is pressed along the mask stage 15 surface against the V-shaped block 17. By means of the strain gauge 27 provided on the mask hand 2, a correct pressing force for the positioning of the mask 1 can be detected.

The pressing force as detected by the strain gauge 27 is monitored by the conveyance CPU 40 as described and, until the pressing force reaches a level within the predetermined range of set pressing force (set pressing force $\pm\alpha$), the traverse unit 6 is displaced to continue the pressing of the mask 1 (steps 59 and 60). When the pressing force detected by the strain gauge 27 reaches a level within the range of set pressing force, the movement of the traverse unit 6 is stopped and, additionally, the mask chuck 16 is rendered into the attracting state (step 61) and the mask hand 2 releases the mask 1 (step 62). Thus, the mask 1 is attracted to and held by the mask chuck 16 in a predetermined engagement state with the V-shaped block 17 of the mask stage 15, whereby it is positioned and fixed with respect to the mask stage 15. After this, the traverse unit 6 is moved toward the mask cassette, and the positioning operation of the mask 1 with respect to the mask stage 15 is accomplished (step 63).

In this embodiment, a DC motor is used as a drive source for the traverse unit 6 and the quantity of rotation of the DC motor is monitored through a feedback loop using an encoder. However, a pulse motor may be used as the drive source and, on that occasion, the rotation of the pulse motor may be controlled in an open loop.

With the structure of the present embodiment, the following advantages are provided.

(1) For the positioning of a mask, the mask is once attracted to a mask chuck of a mask stage prior to the mask pressing operation. This assures attitude correction of the mask along the surface of the mask stage, such that, in the mask pressing operation, the mask is pressed against a reference means of the mask stage along the surface of the mask stage. Therefore, the mask can be positioned accurately without a positioning error such as a gap between it and the reference means.

(2) As the mask is pressed against the reference means on the mask stage, the pressing force applied to the mask is detected. When the detected pressing force reaches the level of a set pressing force, the mask pressing operation is stopped and the mask is attracted to and held by a mask chuck of the mask stage. This is effective to avoid application of an excessive pressing force for the mask positioning and, thus, is effective to prevent strain or distortion of the mask pattern. Further, the pressing force applied to the mask during the positioning operation can be substantially constant and, therefore, a large positional deviation is not caused and the positioning precision is enhanced.

Figure 7:
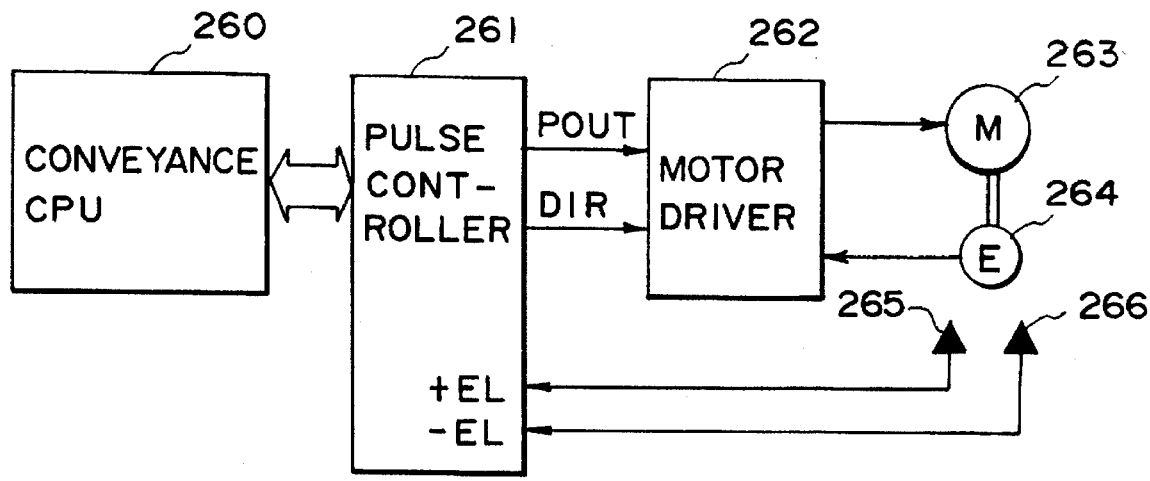
FIG. 7 is a block diagram of another example of a conveyance control system of the mask conveying device of FIG. 2.

Referring now to FIG. 7, another example of a control system for the conveying device will be explained.

In this example, the conveying device is equipped with a conveyance CPU 260 for controlling the conveying system as a whole in response to instructions supplied from a controller, such as a CPU, of a main assembly of an exposure apparatus. Under the control of the conveyance CPU 260, a DC motor 263 is driven through a pulse controller 261 and a motor driver 262, whereby the conveying operation is effected.

In response to a signal from the conveyance CPU 260, the pulse controller 261 supplies to the motor driver 262 a rotational direction signal DIR and a pulse train POUT, corresponding to the quantity of movement of the movable portion, both necessary for rotation of the DC motor 263. In accordance with the rotational direction signal DIR and the pulse train POUT from the pulse controller 261, the motor driver 262 rotates the DC motor 263. Also, the quantity of rotation of the DC motor 263 is monitored constantly by an encoder 264 and is fed back to the motor driver 262. Further, in this conveying device, two limit sensors (position limiting means) 265 and 266 are provided at the opposite ends of the movable stroke of the movable portion on the conveying path. These limit sensors are connected to signal input terminals +EL and −EL of the pulse controller 261, and produce limiting signals in the corresponding conveying directions, respectively. If a limiting signal is outputted from the limit sensor 265 or 266 to the signal input terminal +EL or −EL of the pulse controller 261, the output of the pulse train POUT to the motor driver 262 from the pulse controller 261 is prohibited through hardware logic, whereby the overrunning of the conveying device in a corresponding direction is prevented. This is a function of the pulse controller 261 itself, independently of a control program and is called an "end limit function".

In the conveying device of FIG. 7, however, if the movable portion becomes immovable by collision, for example, no feedback signal is outputted to the motor driver 262 from the encoder 264. Further, in the motor driver 262, accumulated pulses for the motor driving in the direction of conveyance to be made in the conveying operation do not decrease. Therefore, the motor driver 262 continues to apply a driving current to the motor 263.

Figure 8:
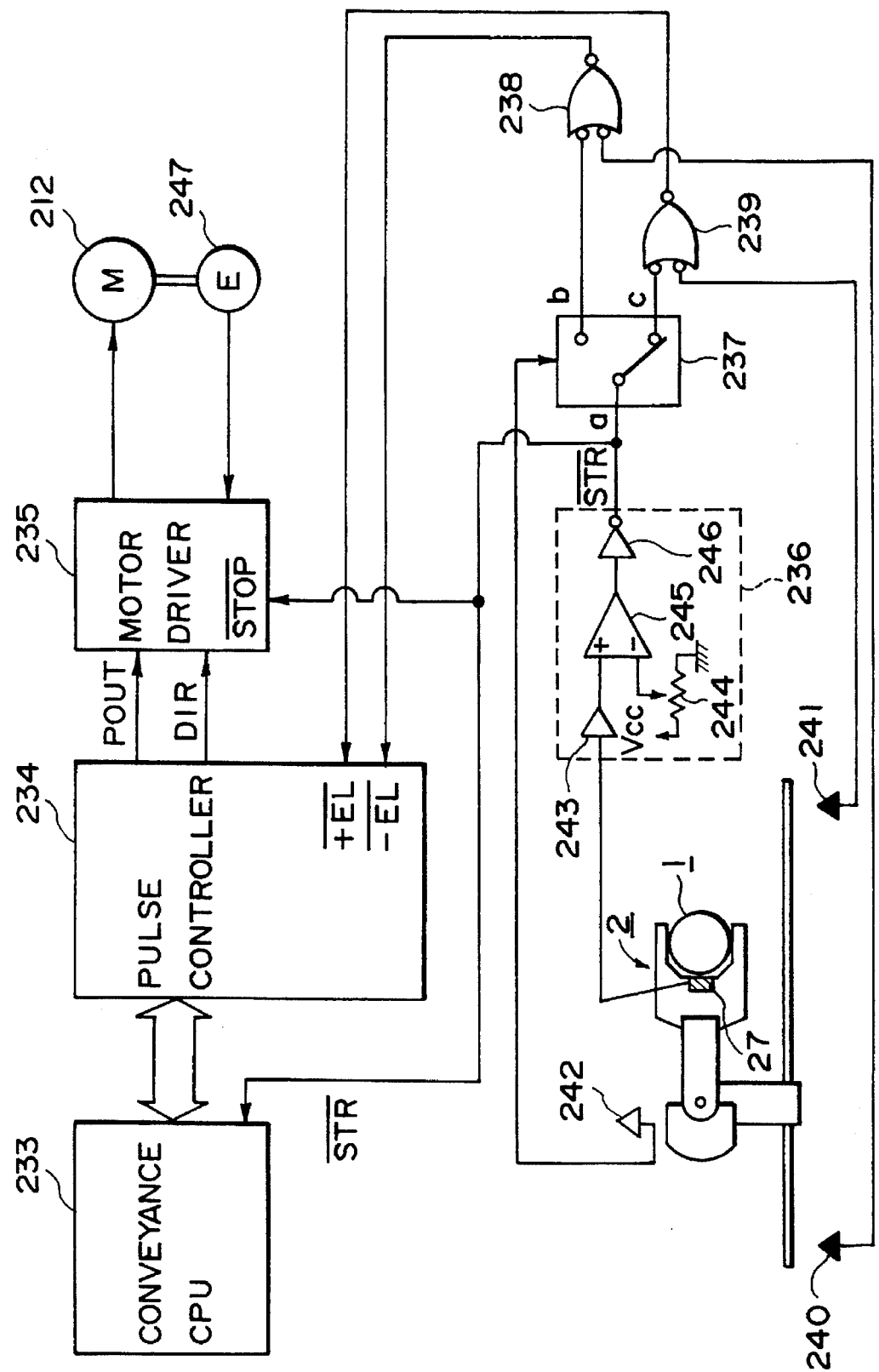
FIG. 8 is a block diagram of another example of a conveyance control system of the mask conveying device of FIG. 2.

An improved conveyance control system for a mask conveying device will be explained, in conjunction with FIG. 8.

This conveyance control system is equipped with a conveyance CPU 233, a pulse controller 234 for outputting a rotational direction signal DIR and a pulse train POUT necessary for rotation of a DC motor 212, a motor driver 235 for driving the DC motor 212 in response to the rotational direction signal DIR and the pulse train POUT, a voltage comparator 236, a switch 237 and two AND circuits 238 and 239.

The voltage comparator means 236 comprises a preamplifier 243, a variable resistor 244 and a voltage comparator 245. The preamplifier 243 receives detection information from a strain gauge 27 provided on the mask hand 2. The variable resistor 244 serves to set a reference voltage which represents the limit of pressing force to be applied to the mask during conveyance thereof. The voltage comparator 245 serves to compare a detection voltage from the preamplifier 243, corresponding to the detection information from the strain gauge 27, with the reference voltage and, if the detection voltage is higher than the reference voltage, it produces and supplies, through an inverter 246, an STR signal for stopping the conveyance of the mask 1.

The STR signal is applied to the conveyance CPU 233, for controlling the conveying system as a whole, a stop terminal of the motor driver 234 and a terminal a of the switch 237. The switch 237 is of the type that the connection terminal is interchangeable in accordance with the orientation of the mask hand 2. More specifically, a mask hand orientation detecting sensor 242 is coaxially mounted with a pin 4 at the engagement between the mask hand 2 and the supporting member 6, and this sensor serves to detect whether the mask hand 2 orientation is in the positive X-direction or in the negative X direction, with reference to a boundary defined by the Y-Z plane (see FIG. 2). If the mask hand 2 orientation is in the positive X direction, in the switch 237 the terminals a and c are connected to each other. If the mask hand 2 orientation is in the negative X direction, in the switch 237 the terminals a and b are connected to each other.

Each of the terminals b and c of the switch 237 is connected to an input terminal of a corresponding one of the AND circuits 238 and 239 each being of a dual-input type. Another input terminal of each of the AND circuits 238 and 239 is connected to a corresponding one of the limit sensors 240 and 241, constituting the position limiting means for the movement of the supporting member 6. Further, the output terminals of the circuits 238 and 239 are connected to signal input terminals -EL and +EL of the pulse controller 234, such that the pulse controller 234 provides an end limit function. The DC motor 212 is connected to an encoder 247, whereby the quantity of rotation of the DC motor 212 is fed back to the motor driver 235.

The operation of the mask conveying device of the present embodiment will be explained.

A mask 1 is taken out of a mask cassette (not shown) disposed at the left-hand side of the mask conveying device (in the negative X direction in FIG. 2) by means of the mask hand 2. After taking out the mask 1, the mask hand 2 moves in the positive X direction to the center of the linear guide 7 while it is being oriented in the negative X direction. At the central position of the linear guide 7, the mask hand 2 is rotated clockwise ($\omega_z$ direction) about the pin 4 in FIG. 2, such that it faces the mask stage 15, as in the state shown in FIG. 1. Then, the mask hand 2 further moves in the positive X direction to transfer the mask 1 to the mask stage 15.

If, in this case (during movement in the positive X direction in the state of FIG. 2), an unwanted obstacle (such as, for example, a portion of the wafer stage to be retracted) is on the conveying path, the mask frame 31 collides against such an obstacle. Then, the leaf spring 26 is flexed and, as a result, the output of the strain gauge 27 increases. If the strain gauge output increases beyond a predetermined (reference voltage), an STR signal is outputted from the voltage comparator 245 to the terminal a of the switch 237. Since, in the switch 237, under the influence of the mask hand orientation detecting sensor 242, the terminals a and c are connected with each other so that the end limit function operates in the direction of orientation of the mask hand 2 (i.e. the positive X direction), the STR signal is passed through the AND circuit 239 and is applied to the +EL terminal of the pulse controller 234. In response, the pulse train POUT from the pulse controller 234 is stopped. If the motor 212 comprises a step motor, the stoppage of the pulse train POUT causes the motor to stop the rotation. However, in the case of a DC motor as in the present embodiment, if pulses for driving the DC motor 212 are accumulated in the motor driver 235, the motor does not stop quickly. In the present embodiment, however, the STR signal is applied also to the stop terminal of the motor driver 35 and, therefore, it is possible to stop the DC motor 212 substantially at the same time as the generation of the STR signal.

Further, since the STR signal is applied also to the conveyance CPU 233, the cause for the stoppage of the DC motor 212 can be discriminated and necessary measures therefor can be taken easily. If, for example, the stoppage occurs during the conveyance of the mask 1 in the positive X direction as described, since in the switch 237 none is connected to the terminal b, the mask hand 2 is movable in the negative X direction unless a signal is inputted to the -EL terminal of the pulse controller 234 from the limit sensor 240, such that an error processing routine can be started immediately.

Figure 9:
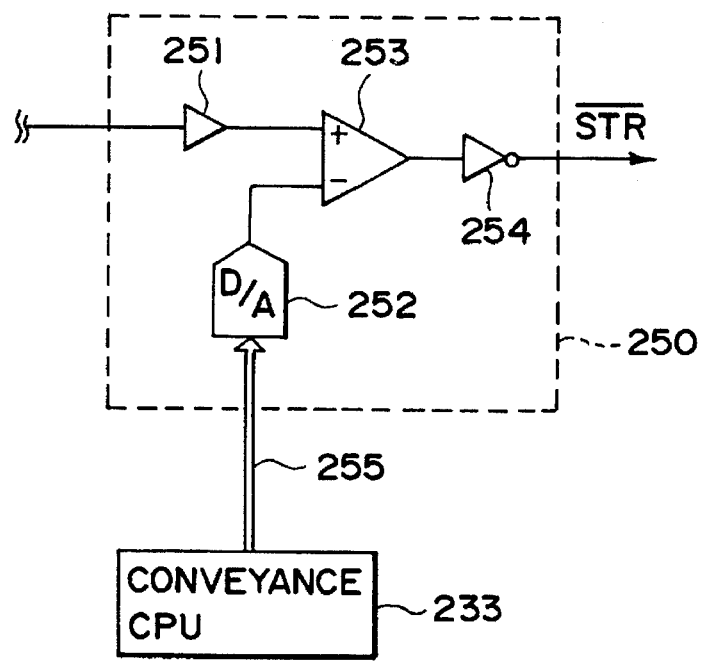
FIG. 9 is a block diagram of another example of a conveyance control system of the mask conveying device of FIG. 2.

Referring now to FIG. 9, another embodiment will be explained. In the preceding embodiment the reference voltage of the voltage comparator means is set by using a variable resistor, in the present embodiment it is set by using a digital-to-analog converter (hereinafter "D/A converter") 252 such as shown in FIG. 9.

In this example, a digital input of the D/A converter 252 is connected through a bus 255 to a similar conveyance CPU 233 as described, such that a desired reference voltage can be set through the conveyance CPU 233.

This makes it possible to change the reference voltage level, outputting an STR signal to stop the conveying operation, in accordance with the type or moving speed of an article to be conveyed, for example.

In the preceding embodiments, the DC motor of the conveying means is stopped only when the pressing force applied to a mask (an article to be conveyed) during the conveyance exceeds a predetermined value. However, it is a possible alternative that a tolerable range for the pressing force of a mask to a strain gauge may be set with its lower limit set to be equal to the pressing force of a mask, gripped by the mask hand, to the strain gauge mounted to the mask hand and with its upper limit set to be equal to the above-described predetermined value for stopping the DC motor. On that occasion, by discriminating during conveyance whether the pressing force detected by the strain gauge is within the tolerable range or not, it is possible to detect fall-off of the mask from the mask hand.

Further, in the preceding embodiments a strain gauge is used as the gripping state detecting means, a piezoelectric type pressure transducer may be used in a similar way.

In these embodiments of the present invention, as described hereinbefore, during conveyance the pressing force applied to an article being conveyed is detected and, if the detected pressing force is greater than a predetermined, the conveying operation of the conveying means is stopped. Therefore, no excessive force is applied to the article and the article can be conveyed safely. Further, if collision occurs during the conveyance, it is possible to prevent damage to the article or the conveying device itself and, therefore, the sureness of safety of the conveying device is enhanced. Additionally, there is an advantage that the cause for increase in the pressing force can be discriminated quickly.

Figure 10:
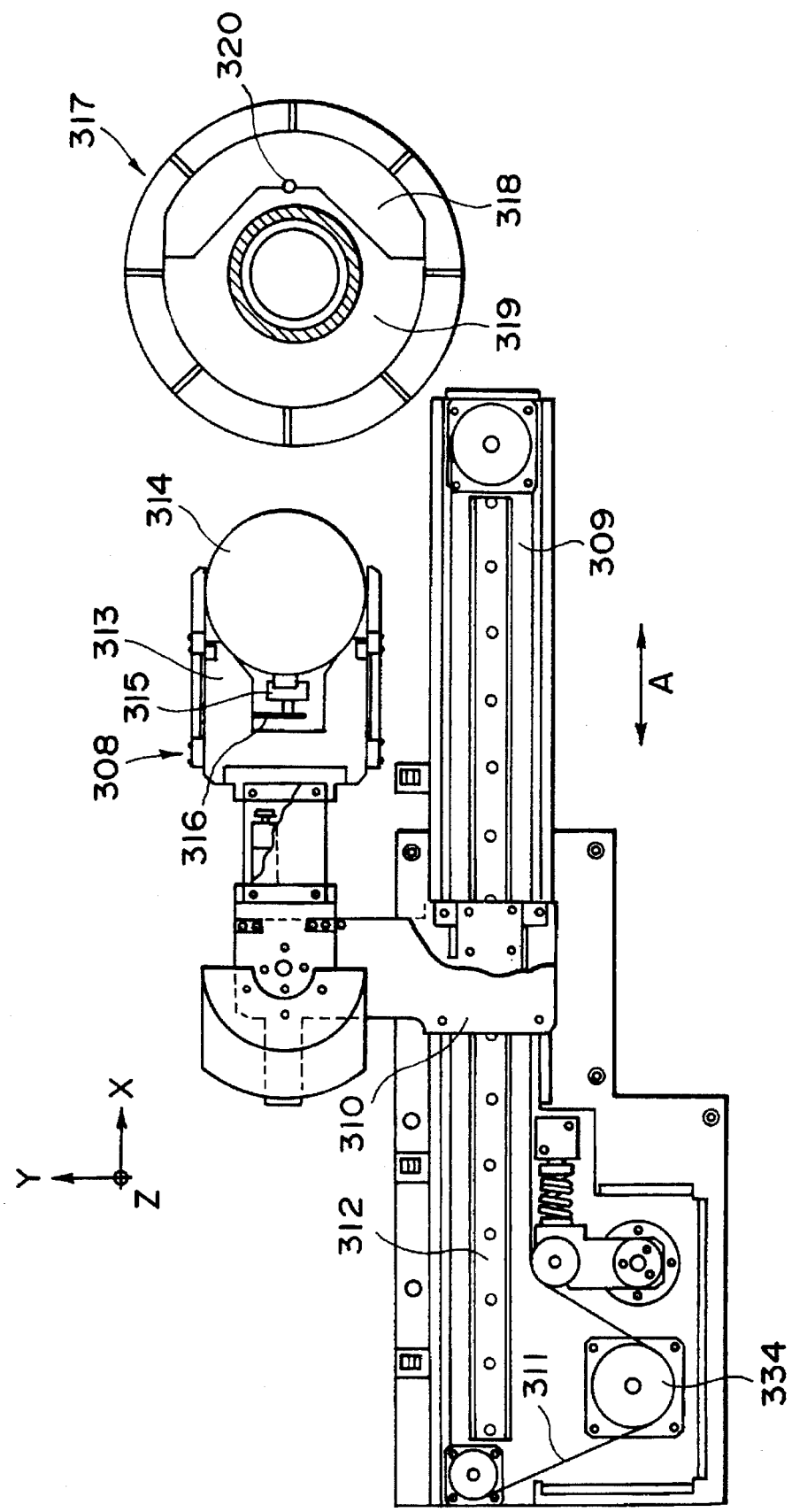
FIG. 10 shows a mask conveying device according to another embodiment of the present invention.

FIG. 10 shows in a plane a mask transfer mechanism to which the present invention is applied. Here, a mask is conveyed with its surface placed upright in a vertical direction.

The mask conveying device includes a mask slide portion 308 and a guide portion 309. Denoted at 310 is a coupling portion through which the slide portion 308 is mounted onto a linear guide 312 of the guide portion 309, for sliding movement in the X-axis direction as denoted by an arrow A. Denoted at 311 is a driving belt for the sliding motion of the slide portion 308. Denoted at 313 is a mask hand for gripping side faces of a mask frame 314. Denoted at 315 is an attracting member for attracting the side face of the mask frame 314 through magnetic means or the like. Denoted at 316 is a pressing force detecting leaf spring having a strain gauge (not shown) adhered on its surface. Actually, the mask frame 314 has a ring-like shape, and a mask (not shown) having a pattern formed on its central part is adhered to the mask frame. Denoted at 317 is a mask stage to which the mask frame 314 is to be transferred, denoted at 318 is a V-shaped block, denoted at 319 is an attracting means, and denoted at 320 is a rotational positioning pin. The remaining portion of the device is essentially the same as the device of FIG. 2.

Figure 11:
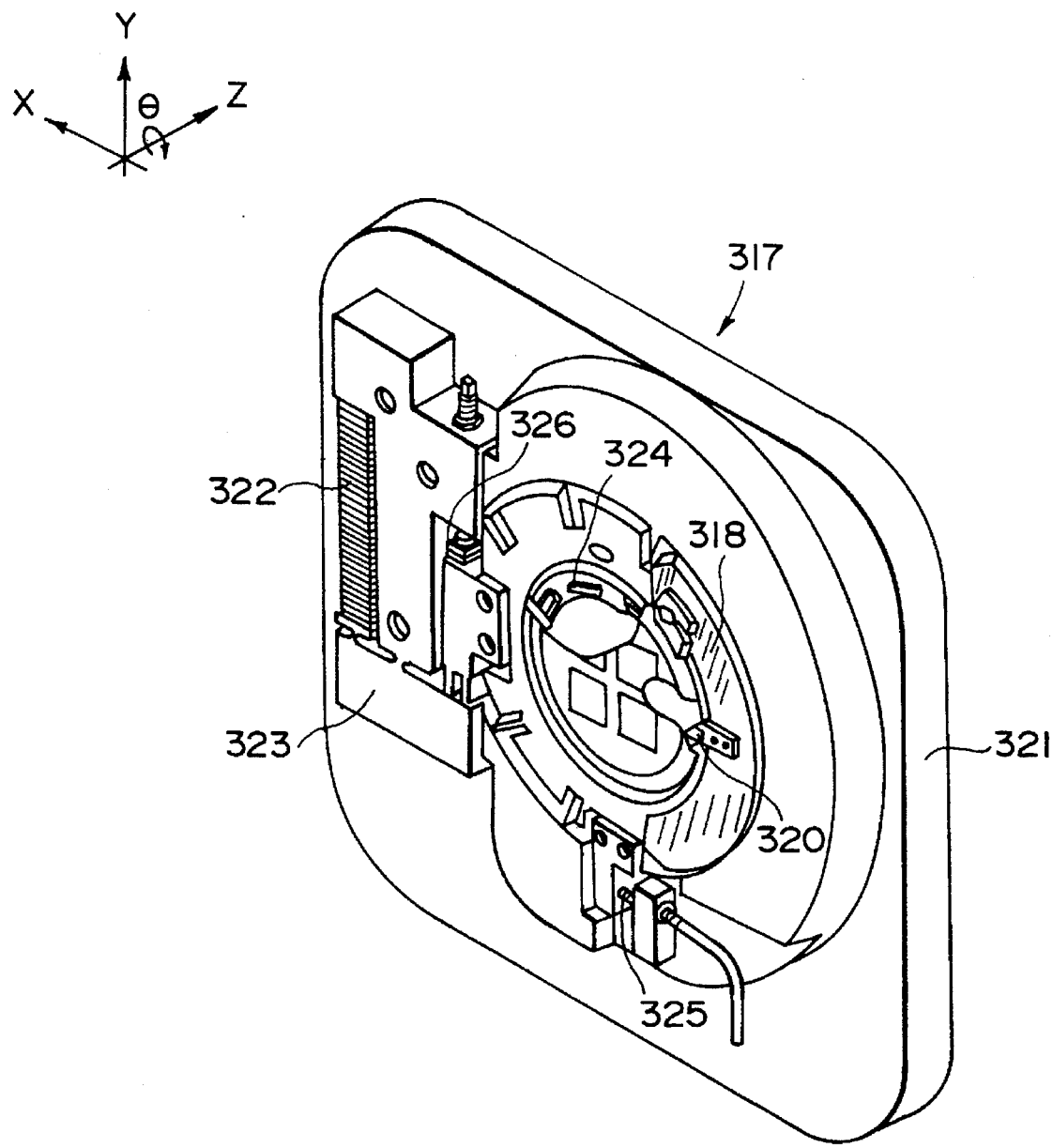
FIG. 11 shows details of a θ stage of the mask conveying device of FIG. 10.

FIG. 11 shows the structure of a θ-drive portion of the mask stage 317. Denoted at 321 is a θ stage base; at 322 is a piezoelectric device for rotational displacement in the θ direction; at 323 is a lever enlarging mechanism for enlarging the displacement of the piezoelectric device 322; at 324 is a mask chuck; at 325 is a displacement sensor for measuring the relative rotational angle of the mask chuck 324, relative to the θ stage base 321, approximately in terms of rectilinear displacement in the circumferential direction; and at 326 is a vibration attenuating damper. The mask 314 held by the mask chuck 324 can be rotationally driven in the θ direction by a drive of the piezoelectric device 322 and through the lever enlarging mechanism 323.

Figure 12:
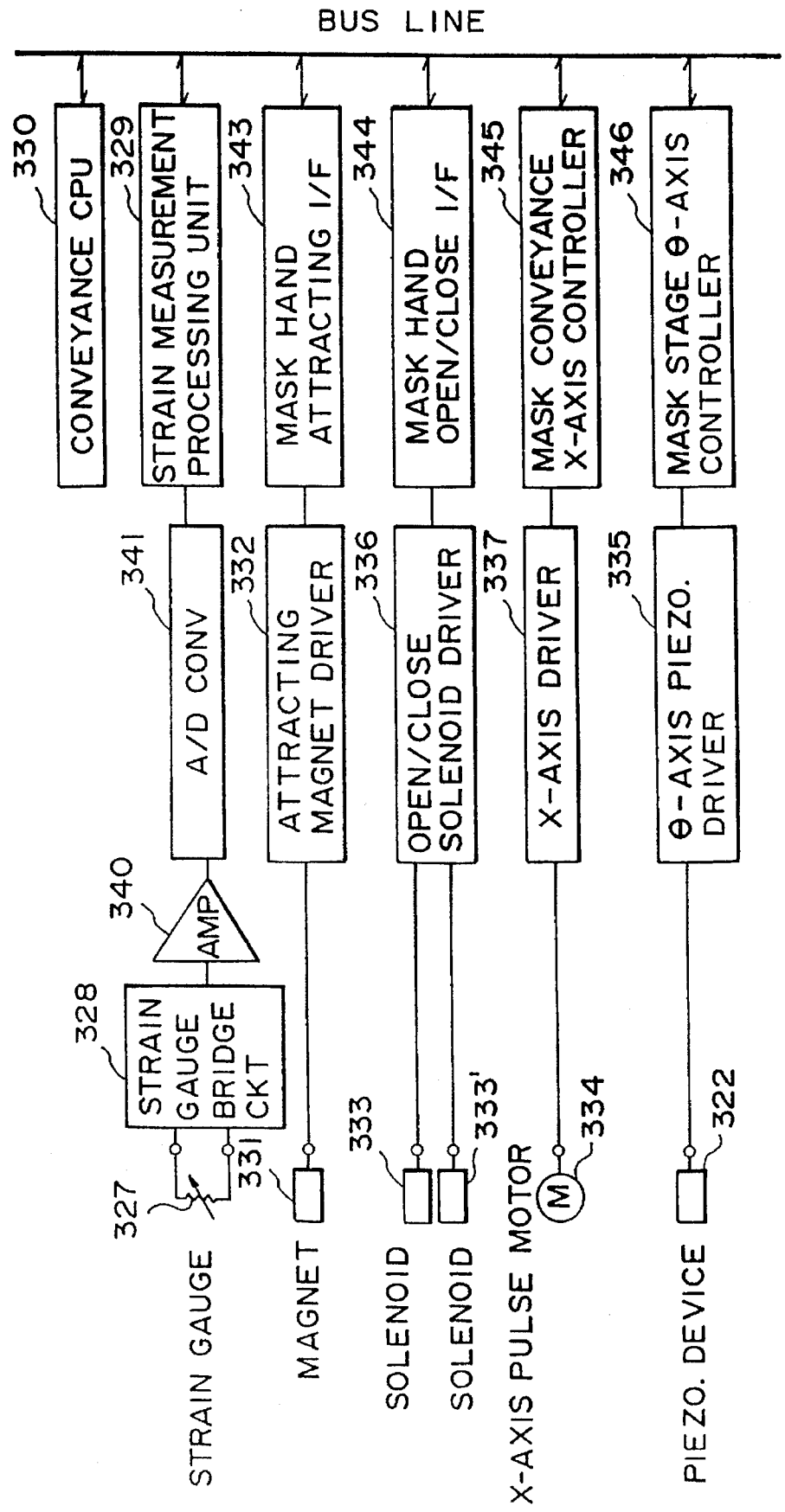
FIG. 12 is a block diagram of an electric control system of the mask conveying device of FIG. 10.

FIG. 12 is a control block diagram of an electric system of the mask conveying and transferring mechanism. The strain gauge 317 adhered to the pressing force detecting leaf spring 316 (FIG. 10) is connected to a strain computing circuit 329 through a bridge circuit 328, an amplifier 340 and an A/D converter 341. The computing circuit 329 is coupled to a CPU 330 through a bus line. The attracting means 315 (FIG. 10) for attracting side surfaces of the mask frame is mountably/demountably controlled by a magnet 331 which is driven by a driver 332. The opening/closing control of the mask hand 313 (FIG. 10) is executed through two solenoids 333 and 333' which are energized by the driver 332. The slide portion 8 (FIG. 10) is driven by a pulse motor 334 through an X-axis driver 337. The drive of the piezoelectric device 322 (FIG. 11) is controlled through a driver 335. The computation of the quantity of strain based on the output of the bridge circuit 328 as well as the drive of the drivers 332,335,336 and 337 are executed under sequence control of the CPU 36 through the bus line and respective interfaces 343, 344, 345 and 346.

In this embodiment, for the positioning of a mask being placed upright in a vertical direction, the mask frame 314 can be pressed against the V-shaped block 318 with three, first to third, different forces.

Figure 13:
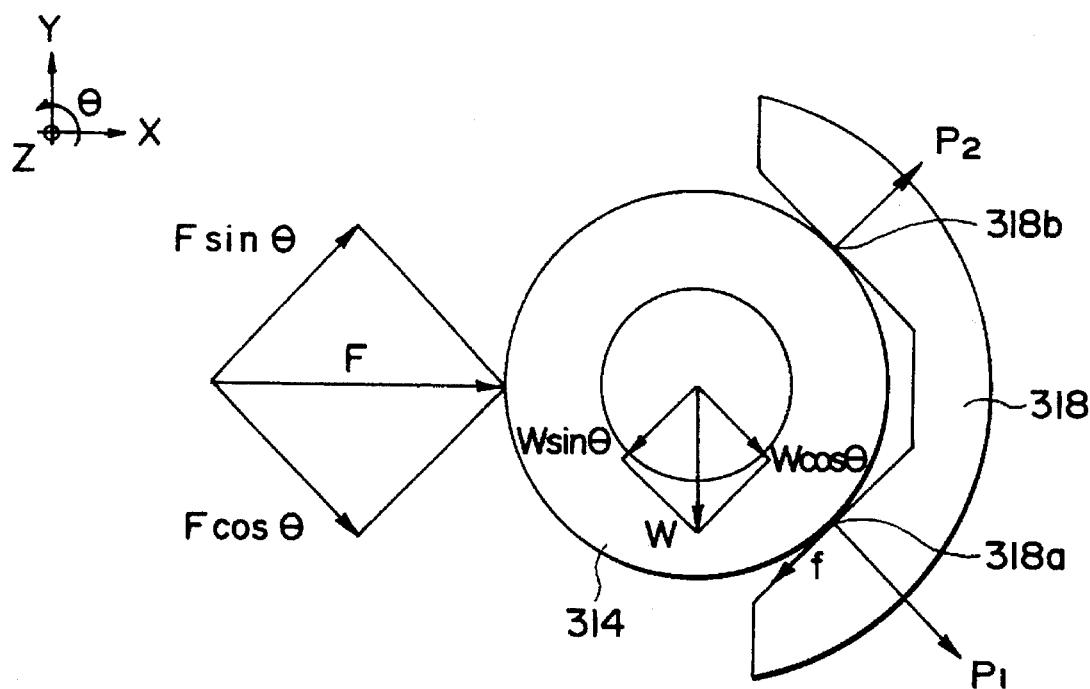
FIG. 13 is a schematic illustration, for explaining the pressing force to a V-shaped block.

The pressing force (abutting force) of the mask frame 314 to the V-shaped block 318 can be calculated in the following manner: In FIG. 13, F is the abutting force, W is the mask frame weight, f is the friction force between the mask frame 314 and the V-shaped block 318, θ is a half of the opening angle (2θ) of the V-shaped block 318, μ is the friction coefficient between the V-shaped block 318 and the mask frame 314, and P1 and P2 are the forces applied to two surfaces (two points) 318a and 318b of the V-shaped block 318. Then, from the drawing, it is seen that:

$$P1 = F\cos\theta + W\sin\theta$$
$$P2 = F\sin\theta - f - W\sin\theta$$
$$= F\sin\theta - \mu(W+F)\sin\theta - W\sin\theta$$

Therefore, the pressing force applied to the two points on the V-shaped block 318 (pressing force for intimately contacting the mask frame 314 to the V-shaped block) F is expressed as follows:

$$F=[W\sin\theta(1+\mu)+P2]/[\sin\theta(1-\mu)]$$

In this embodiment, the calculation is made under the conditions that: the mask weight (W) including the weight of the mask frame is 120 g, the friction coefficient (μ) is 0.4, the force (P2) applied to the V-shaped block is 10 g, and θ is equal to 45 deg.

The first pressing force as described is the pressing force for ensuring certain engagement of the mask frame with the two surfaces of the V-shaped block. If the first pressing force is too small, it is possible that the mask frame contacted to one surface of the V-shaped block is stopped due to the friction with the one surface and it does not contact the other surface. In consideration thereof, a pressing force F of a certain magnitude or more is necessary for enhanced reliability of positioning in the X and Y directions as well as constant reproducibility. In this case, the mask pattern strain is in a range of resilience and, since the pressing force is weakened as the mask is attracted, as will be described later, it does not degrade the pattern precision. In this embodiment, the first pressing force is set to be equal to 320 gf in accordance with the quantity as calculated by using the aforementioned equation.

The second pressing force is the pressing force for the positioning of the mask frame in the θ direction. More particularly, when the θ stage 324 is rotated with the mask frame 314 being aligned with respect to the pin 320 of the mask stage 317 (FIG. 10), the pressing force F to the V-shaped block 318 is made very small, such as zero (0), for example. This makes it possible to prevent production of foreign particles through sliding friction between the mask frame and the V-shaped block. Further, even if the gripping force of the mask hand 308 is weak, it is possible to prevent displacement of the mask frame 314 with the V-shaped block 318. In this embodiment, the second pressing force is set to the equal to 0 (zero) gf, for example.

The third pressing force is the pressing force as the mask frame positioned with respect to the X, Y and θ directions is to be attracted. By fixing and holding the mask (mask frame) with the third pressing force, smaller than the pressing force for the X and Y axis positioning, it is possible to suppress the pattern distortion, caused at the time of positioning, to a level in a predetermined allowable range. This force is the lower limit force, not causing degradation of the positioning precision of the mask with respect to the X and Y directions. In this embodiment, in consideration thereof, the third pressing force is set to be equal to 240 gf.

Figure 14:
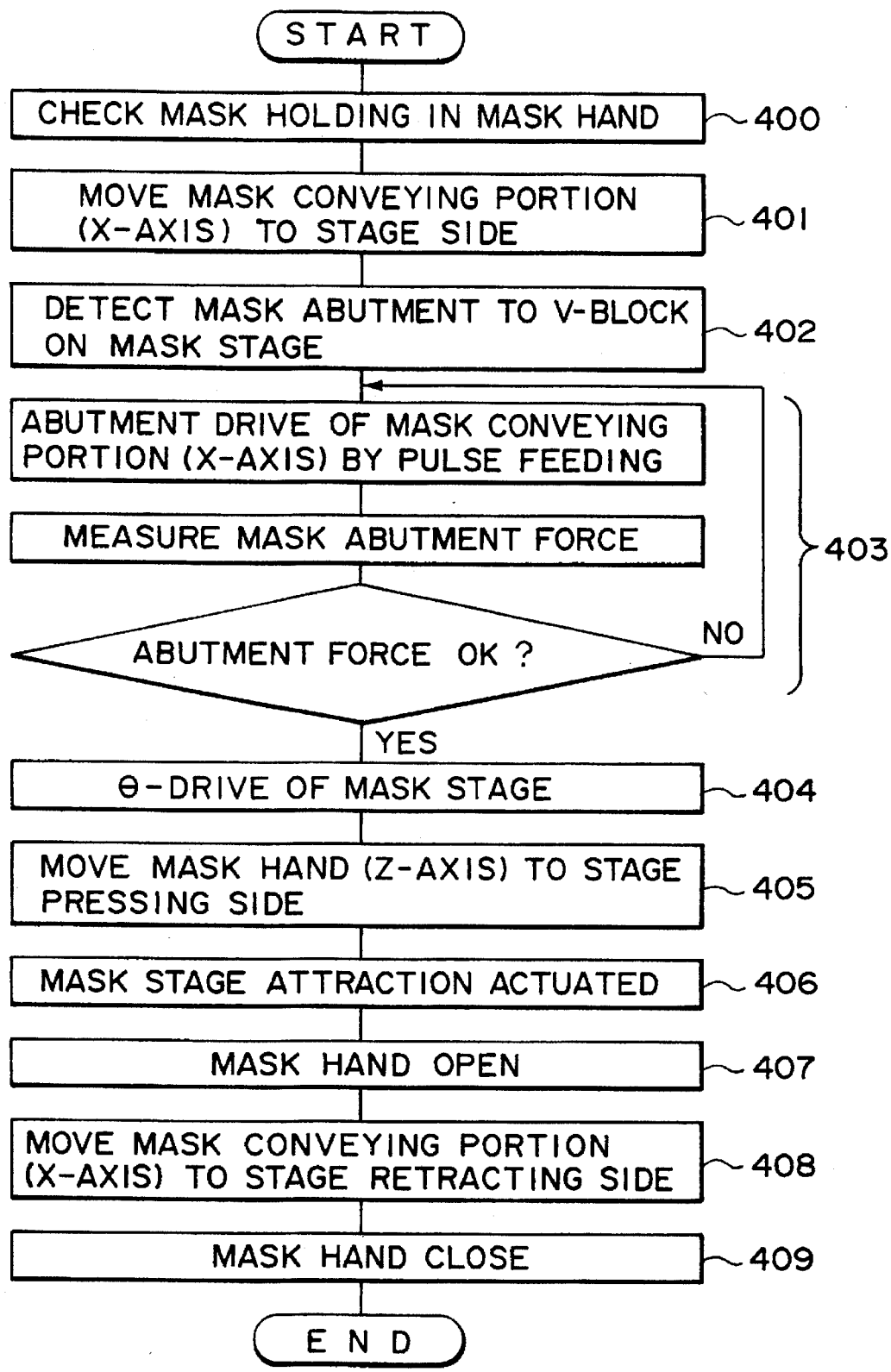
FIG. 14 is a flow chart, for explaining an example of operation of the mask conveying device of FIG. 10.

FIG. 14 illustrates an example of a mask transfer sequence.

If the holding of the mask by the mask hand is discriminated (step 400), the X-axis stage 310 of the mask conveying device is driven to convey the mask toward the V-shaped block 318 on the mask stage 317 (step 401). As the mask engages with the V-shaped block, it is detected (step 402). The pulsewise feeding by the motor 334 is continued until the mask presses the V-shaped block 318 with a predetermined pressing force (step 403). If the predetermined pressing force is attained, on an assumption that the positioning of the mask in the X and Y directions is accomplished, θ drive of the mask stage 324 is effected to rotate the mask for the positioning of the same in the θ direction (step 404). Subsequently, the mask frame is pressed toward the stage 317 along the Z axis (rotational axis) (step 405). With the mask being pressed by a predetermined pressing force, it is attracted to the stage 317 (step 406). Thereafter, the mask hand 308 is opened (step 407) and the conveying portion is moved away from the stage position (step 408), and thereafter the mask hand 308 is closed (step 409). By this, the mask transfer is accomplished.

In accordance with this sequence, however, since the θ drive is effected with the mask frame being pressed strongly against the V-shaped block, there is a high possibility of production of foreign particles due to the sliding friction between the mask (mask frame) and the V-shaped block.

The mask positioning method according to an aspect of the present invention can be embodied in two control methods.

A first method is one in which the strain gauge fixed to the leaf spring 316 is used. More particularly, in this method, the pressing force of the mask frame (mask strain) is produced by pressing, through the leaf spring 316 (FIG. 10) of the mask hand 308, the attracting member 315 which is attracting and holding the mask frame 314, and the pressing force corresponding to the mask strain is measured by electrically detecting the quantity of flexure of the leaf spring 316 by the pressing force, as a change in resistance of the strain gauge adhered to the leaf spring 316. On the basis of the detected pressing force, the first to third pressing forces F are calculated and, in accordance with these pressing forces, the actuators are feedback controlled.

A second method is one in which the relationship between the pulsewise feeding quantity of the motor 334 and the pressing force corresponding to the mask strain (strain of the leaf spring) is detected beforehand and, on the basis of this relationship, a necessary number of pulses for obtaining a predetermined pressing force is determined, and the actuators are open/controlled accordingly.

Figure 15:
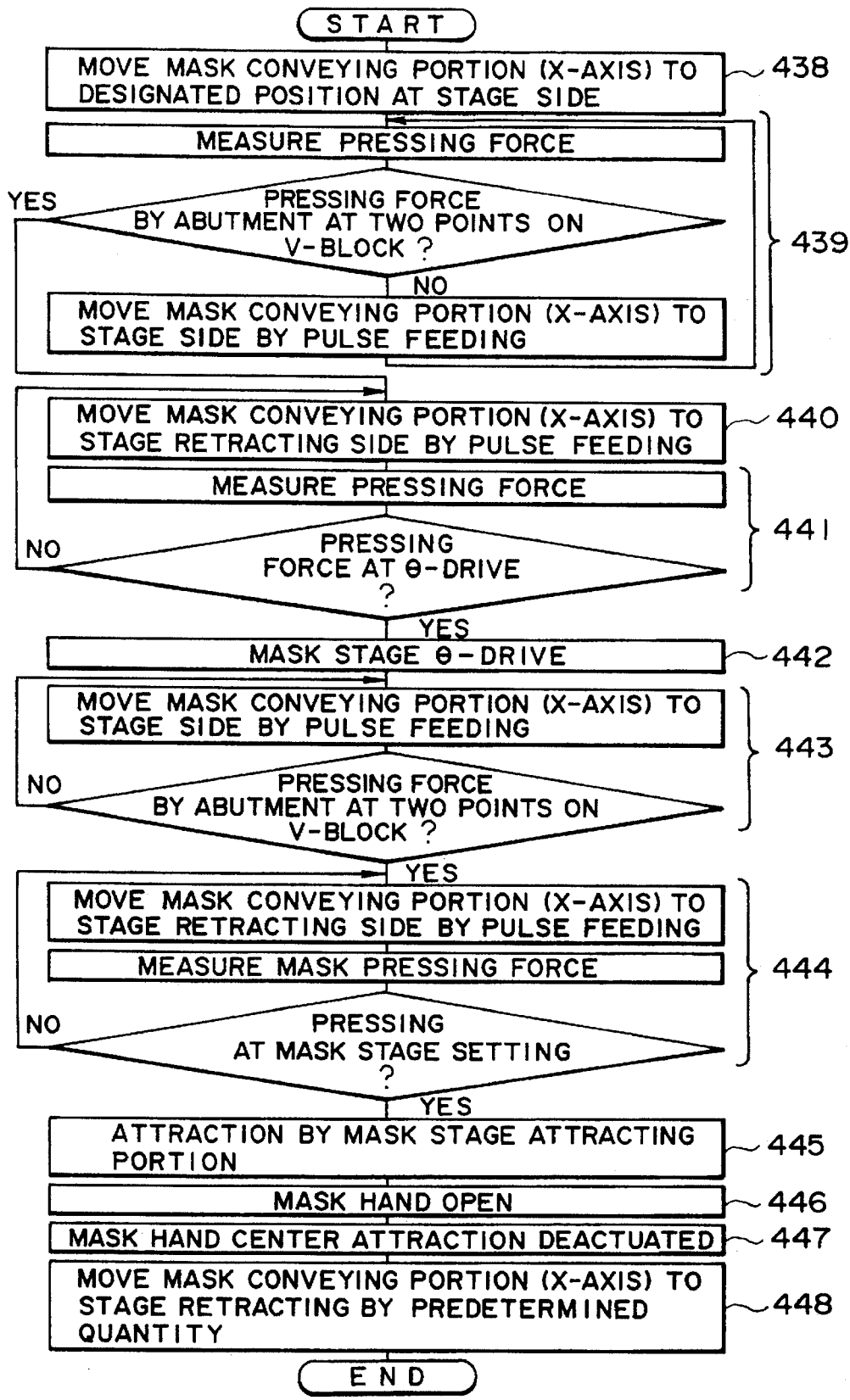
FIG. 15 is a flow chart, for explaining another example of operation of the mask conveying device of FIG. 10.

FIG. 15 shows the flow of sequence control according to the first method. In response to the mask conveying instruction from the CPU 330, the mask hand 308 moves toward the mask stage 317 (step 438). As the mask (mask frame) engages with the V-shaped block 318, the pulsewise feeding of the motor 334 is continued until the first pressing force (320 gf) is provided (step 439). If the first pressing force is reached, the pulse motor 334 is driven reversely (step 440). This reverse feeding is continued until the pressing force of the mask becomes equal to the second pressing force (0 gf) or a predetermined threshold near it (step 441). If the second pressing force is attained, the pulse motor drive is stopped and the θ stage 324 is θ-rotated by the piezoelectric device 322 (step 442).

Subsequently, the pulse motor is driven again to provide the first pressing force as the pressing force against the V-shaped block (step 443) and, subsequently, the pulse motor is driven reversely so as to establish the third pressing force (240 gf) as the pressing force against the V-shaped block (step 444). As the third pressing force is reached, the motor drive is stopped and the mask frame is attracted to and held by the mask chuck 324 (step 445). Thereafter, the mask hand is opened to release the mask (step 446) and the attraction of the attracting member 315 is turned off (step 447). The mask hand is then moved away from the stage position (step 448), whereby the mask transfer is accomplished.

Figure 16:
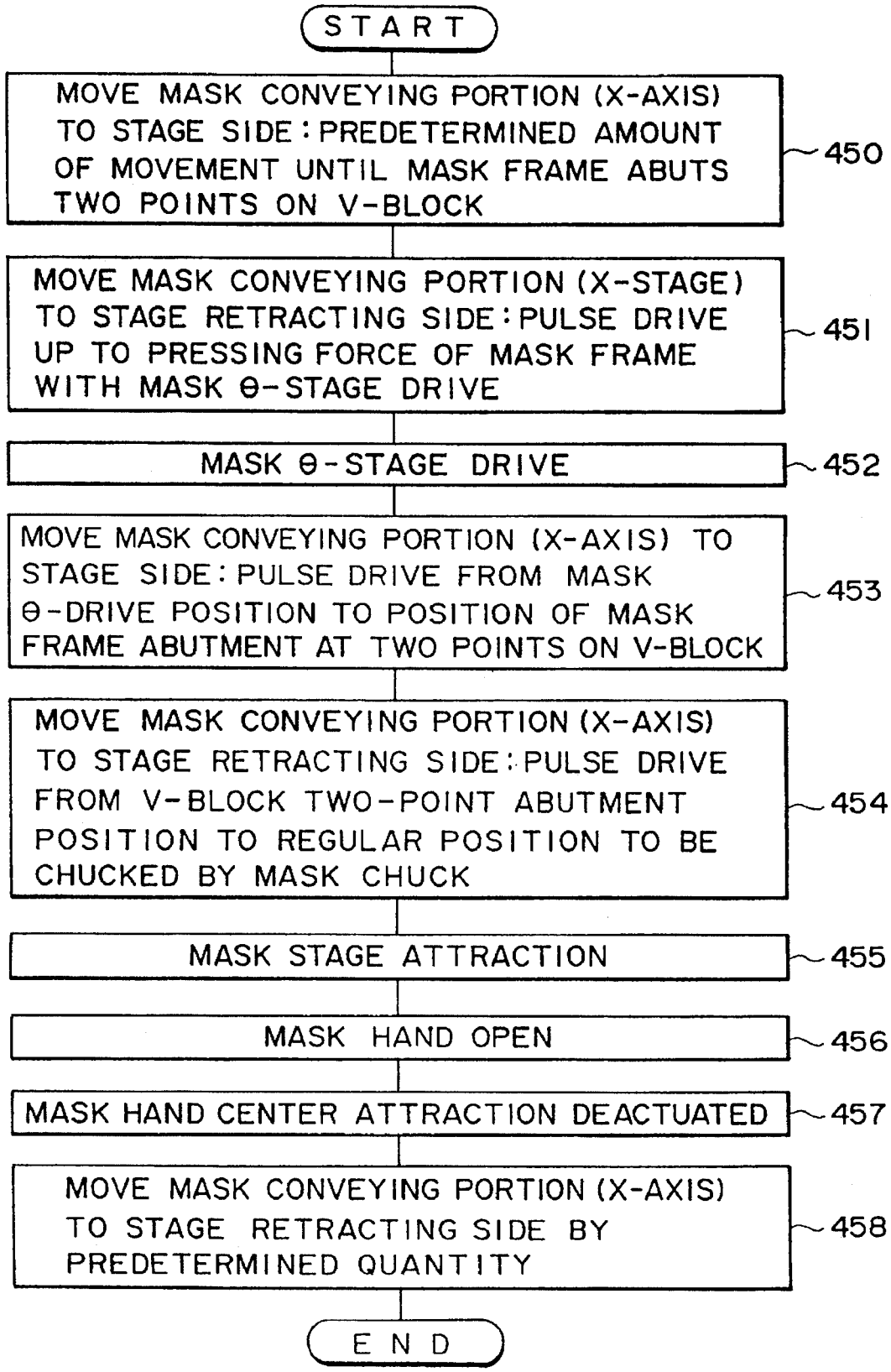
FIG. 16 is a flow chart, for explaining another example of operation of the mask conveying device of FIG. 10.

FIG. 16 shows a sequence control flow for the mask positioning according to the second method. First, the mask hand 308 is moved toward the mask stage 317, and the pulse feeding of the motor 334 is effected until the first pressing force is reached (step 450). For such pulse feeding, the passage of the mask hand 308 by a predetermined position may be detected, and the number of pulses necessary for obtaining the first pressing force, from the detected position, may be determined beforehand, such that the motor feeding may be effected by the determined number of pulses.

After the first pressing force is attained, the motor 334 is driven reversely by an amount corresponding to a predetermined number of pulses, to thereby attain the second pressing force (step 451). In this state, the stage 324 is θ-rotated (step 452). Then, the motor 334 is driven again in the positive direction (pressing direction) by a predetermined number of pulses, to thereby attain the first pressing force (step 453). Subsequently, the motor 334 is driven reversely by a predetermined number of pulses, so as to reduce the pressing force to the third pressing force (step 454). In this state, the mask frame is attracted to the mask stage 317 and is held thereby (step 455). After this, the mask hand 308 is opened to release the mask 314 (step 456), and the attraction of the mask 314 by the attracting member 315 is turned off (step 457). The mask hand is then moved away from the stage position (step 458), whereby the mask transfer is accomplished. In accordance with the second method, use of a strain gauge is not necessary. Thus the structure for the control is simple and the operation time is shorter.

In these embodiments of the present invention, as described hereinbefore, a mask frame is pressed against a positioning V-shaped block with a predetermined pressure, with the mask frame being placed upright substantially in a vertical direction and, after this, the pressing force is weakened and then the θ rotation and mask attraction are effected. Therefore, it is possible to suppress production of foreign particles due to the friction between the mask frame and the V-shaped block during the θ rotation. Also, the pressing force can be controlled in consideration of mask strain and, therefore, the strain can be maintained in a low constant range. Thus, variation in mask pattern strain can be reduced. Further, the X and Y positioning can be made with a predetermined high pressing force, and the positioning precision or the reproducibility does not degrade. Additionally, the θ rotation or the mask attraction is effected with a decreased pressing force, damage or abrasion of the V-shaped block surface can be prevented, and protection of the V-shaped block is attained and, on the other hand, a decrease in the positioning precision is avoided.

Figure 17:
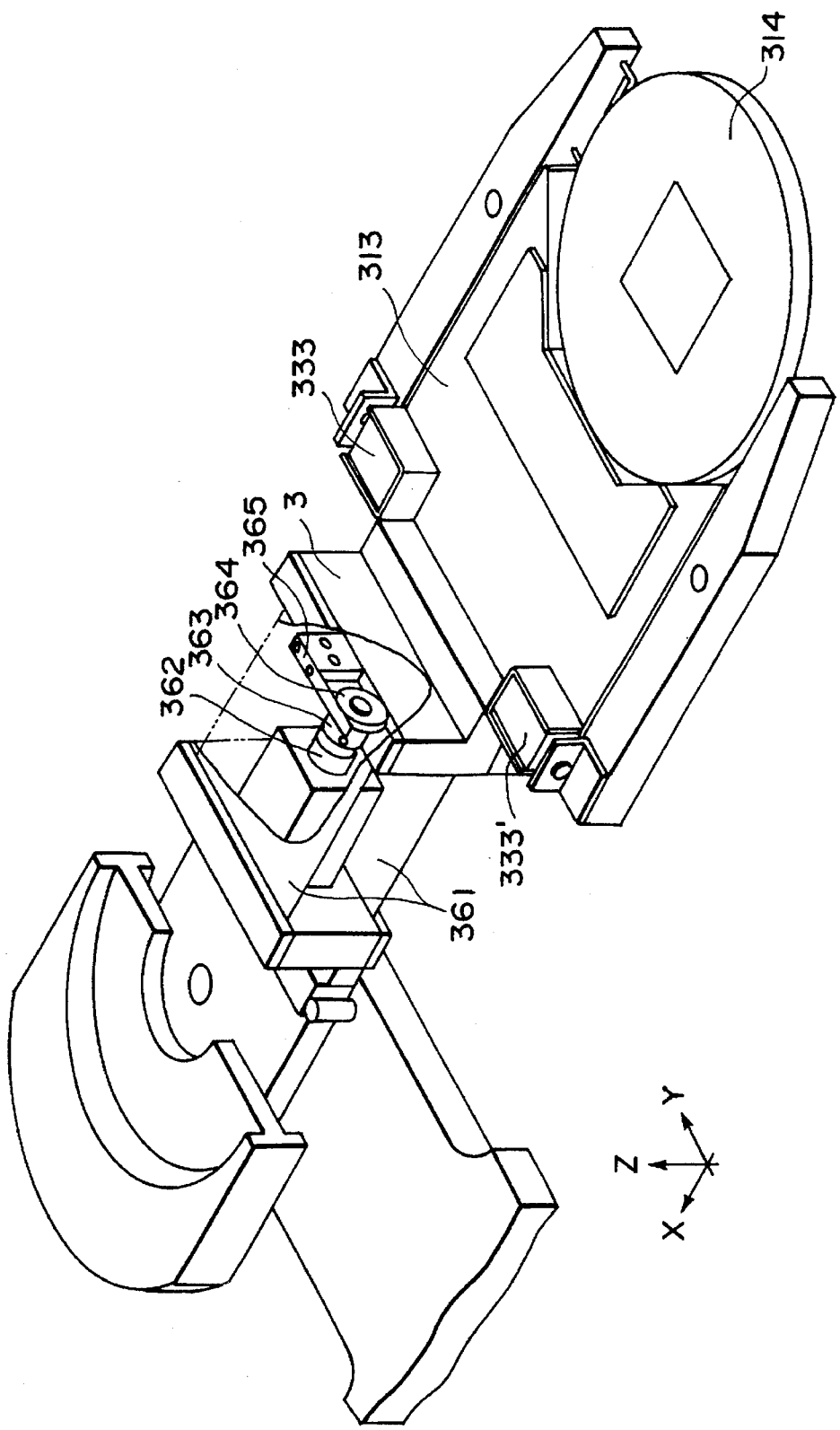
FIG. 17 shows a mask conveying device according to another embodiment of the present invention.

FIG. 17 shows another embodiment of the mask transfer mechanism, which is a modified form of the FIG. 10 embodiment. In FIG. 17, denoted at 361 is a parallel leaf spring mechanism which comprises two leaf springs for supporting an arm unit 3 movably in the Z-axis direction relative to a base 4 (see FIG. 2). An end of the leaf spring mechanism is fixed to the base 4, while the other end thereof is fixed to the arm unit 3. The arm unit 3 includes a mask hand 313 on which two solenoids 333 and 333' for opening/closing two fingers 21 are provided.

A Z-axis drive motor 362 is fixed to the base 4 and comprises a DC motor, for example. The motor 362 has an output shaft which is coupled to a bearing 364 through an eccentric coupling 363. Denoted at 365 is a bearing guide provided on the arm unit 3, for holding the eccentric coupling 363. With this structure, as the eccentric coupling 363 is rotated by the motor 362, the mask hand 313 moves in the Z-axis direction while causing deformation of the leaf spring 361 in accordance with the quantity of eccentricity. The remaining portion of this embodiment is essentially the same as that of the FIG. 10 embodiment.

Figure 18:
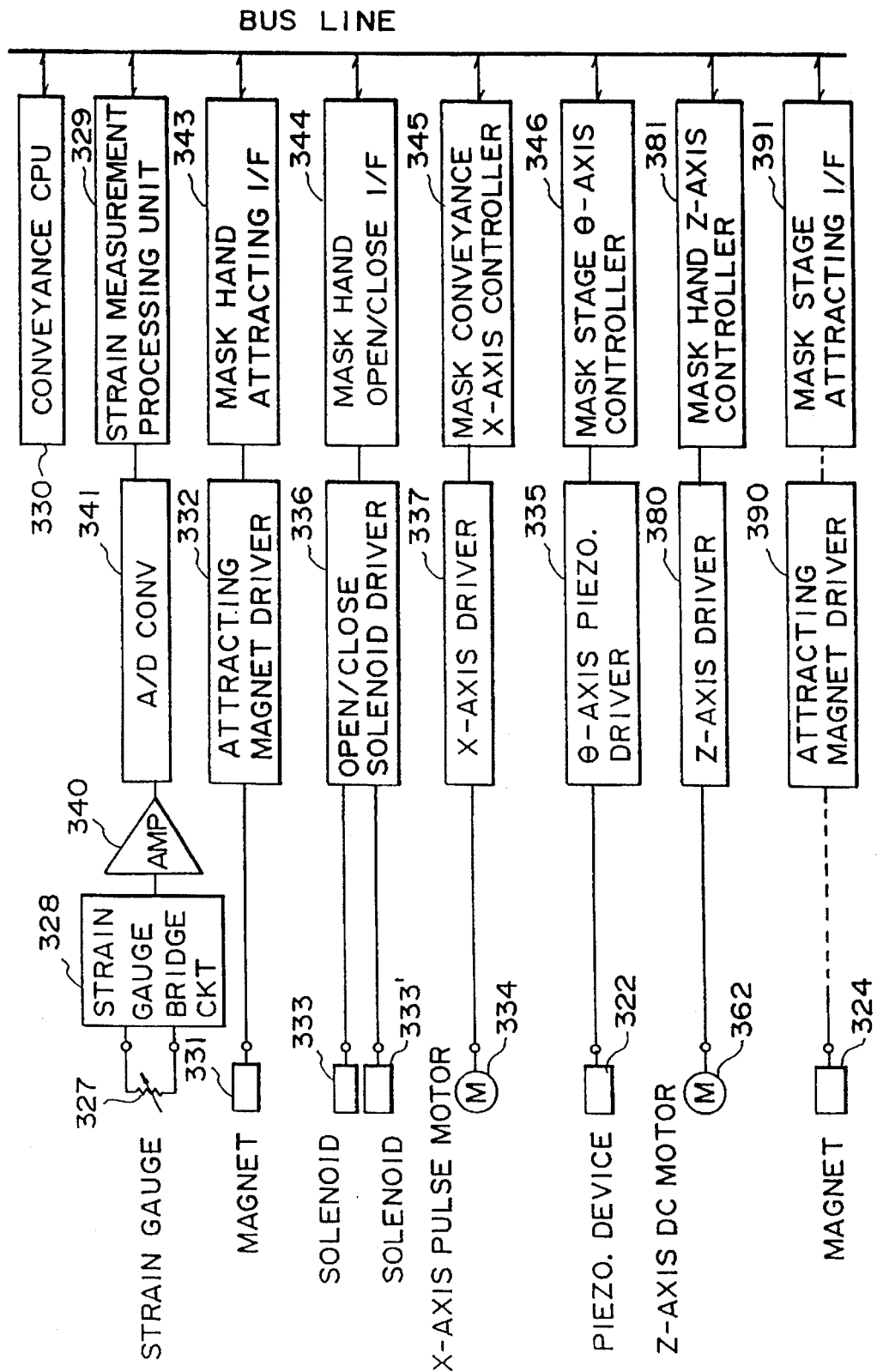
FIG. 18 is as block diagram of an electric control system of the mask conveying device of FIG. 17.

FIG. 18 shows a control block of the mask transfer mechanism of FIG. 17. In FIG. 18, denoted at 381 is a mask hand controller for controlling the drive of the Z-axis driving motor 362 through a Z-axis driver 380. Denoted at 390 is an attracting magnet driver 390 for on/off-switching of attraction of a magnet 324, for attracting the mask 314 to the mask stage 317 of FIG. 10. Denoted at 391 is a mask stage attraction interface (I/F) which is provided between the magnet driver 390 and the conveyance CPU 330. The mask hand controller 381 and the mask stage attraction interface 391 are provided to control the Z-axis drive motor 362 and the magnet 324, respectively, in response to instruction signals from the conveyance CPU 330. The remaining portion of the structure of this embodiment is essentially the same as the FIG. 12 embodiment.

Referring now to the flow charts of FIGS. 19 and 20, the operation of this embodiment will be explained. Here, FIG. 19 illustrates further improvements in operation wherein the strain gauge adhered to the leaf spring 316 (FIG. 15) is used, while FIG. 20 illustrates further improvements in operation wherein the strain gauge shown in FIG. 16 is not used.

Figure 19A:
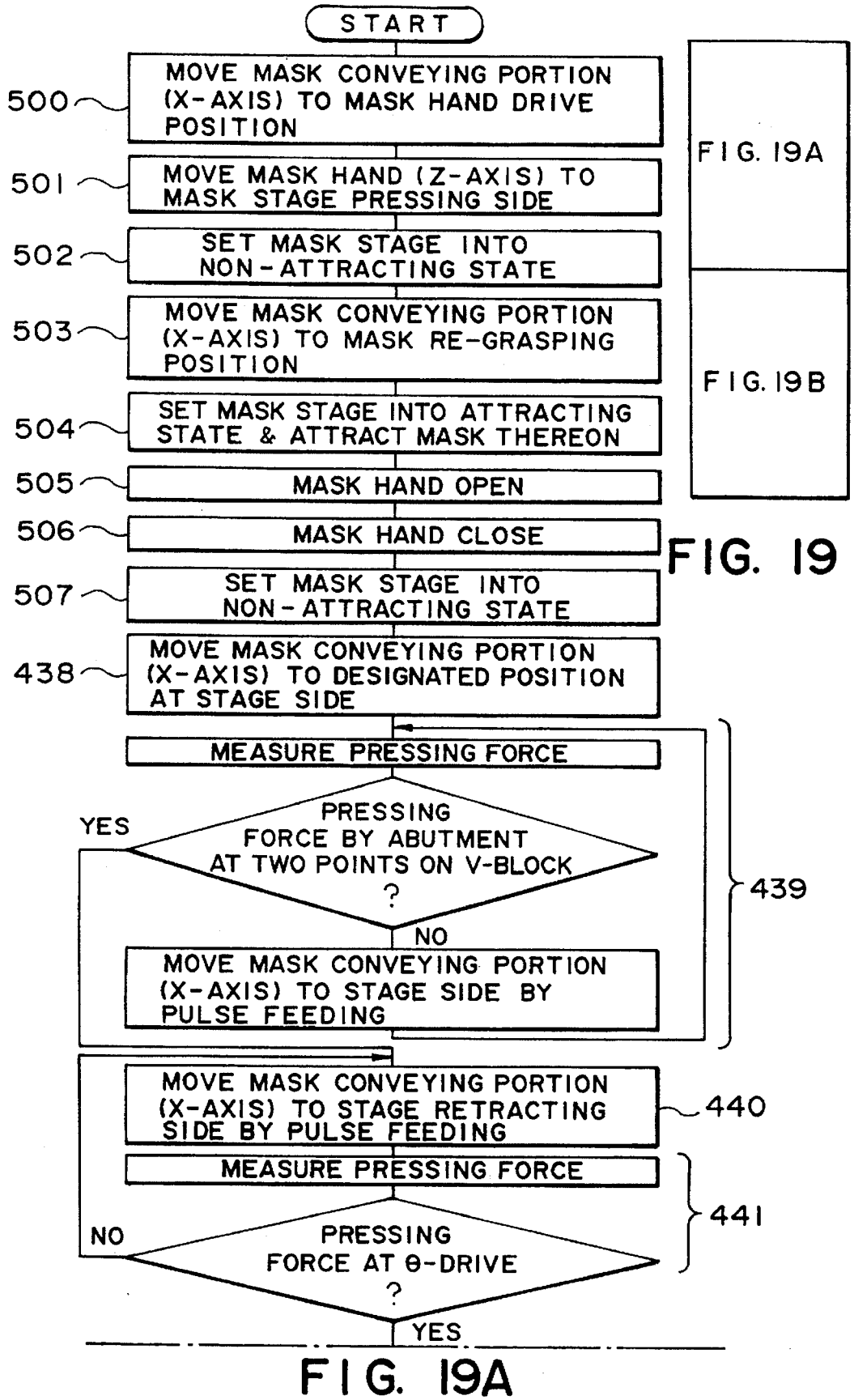
FIG. 19 is a flow chart, for explaining an example of operation of the mask conveying device of FIG. 17.
Figure 19B:
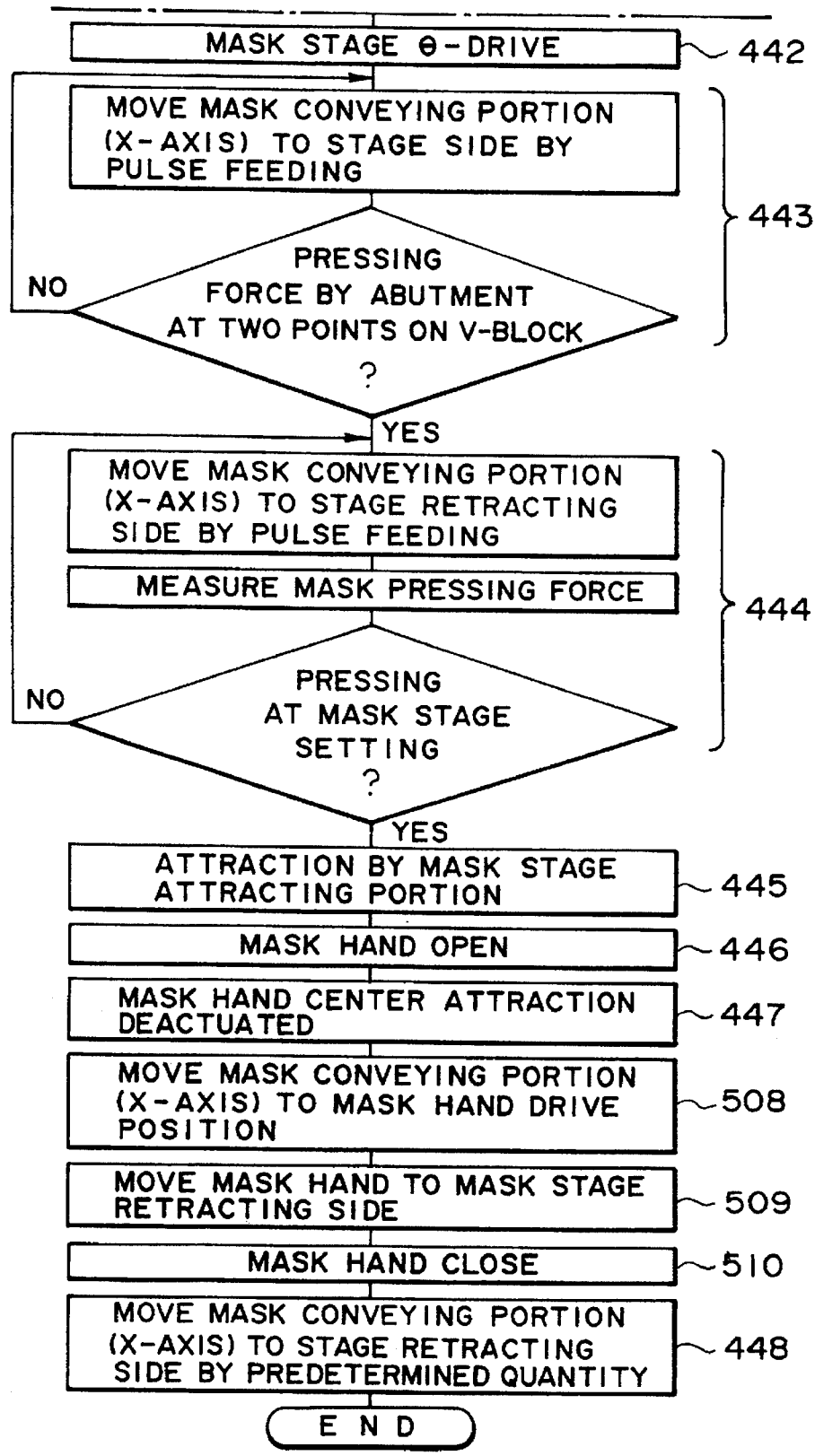
Figure 20A:
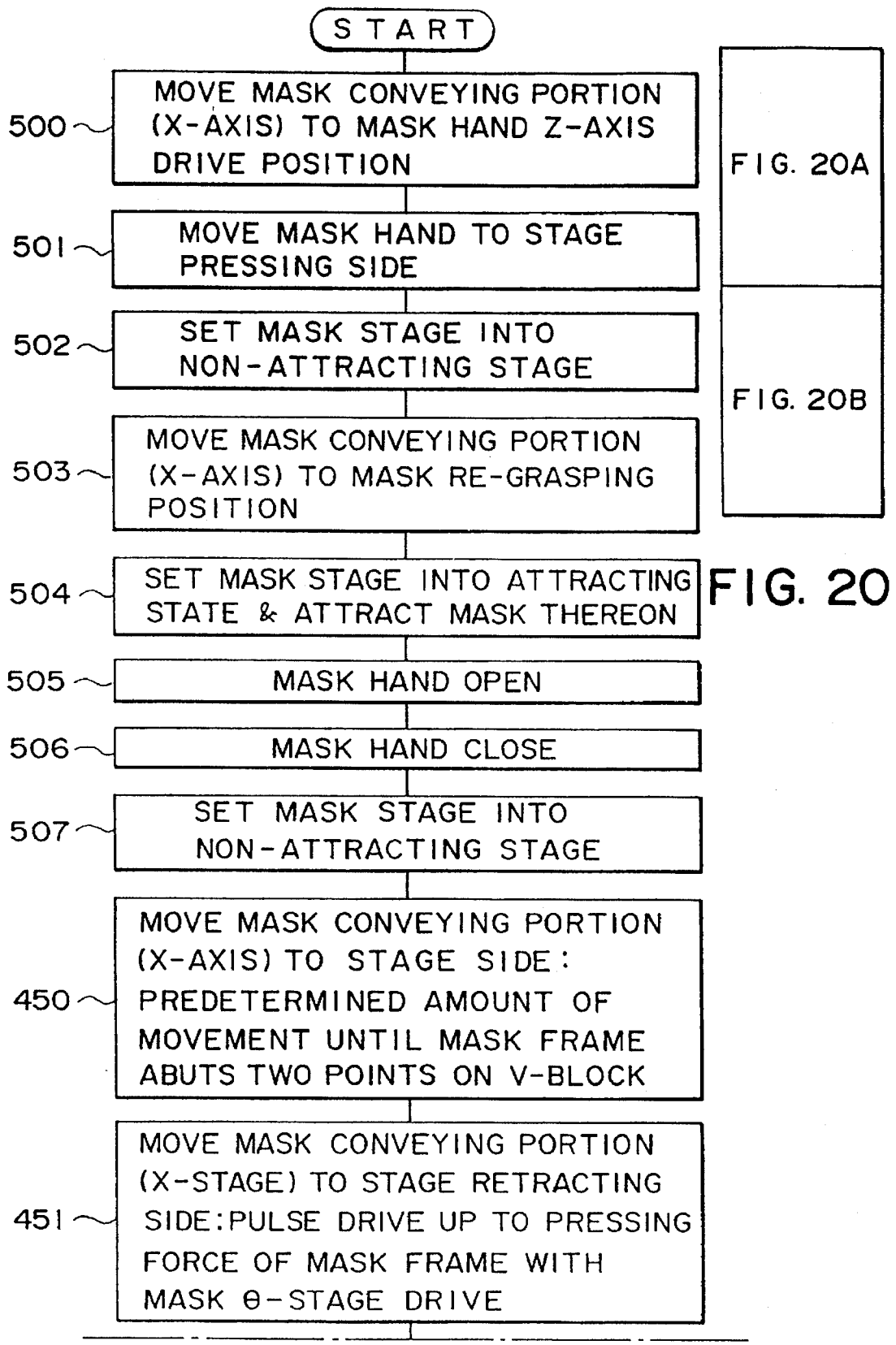
FIG. 20 is a flow chart, for explaining another example of operation of the mask conveying device of FIG. 17.
Figure 20B:
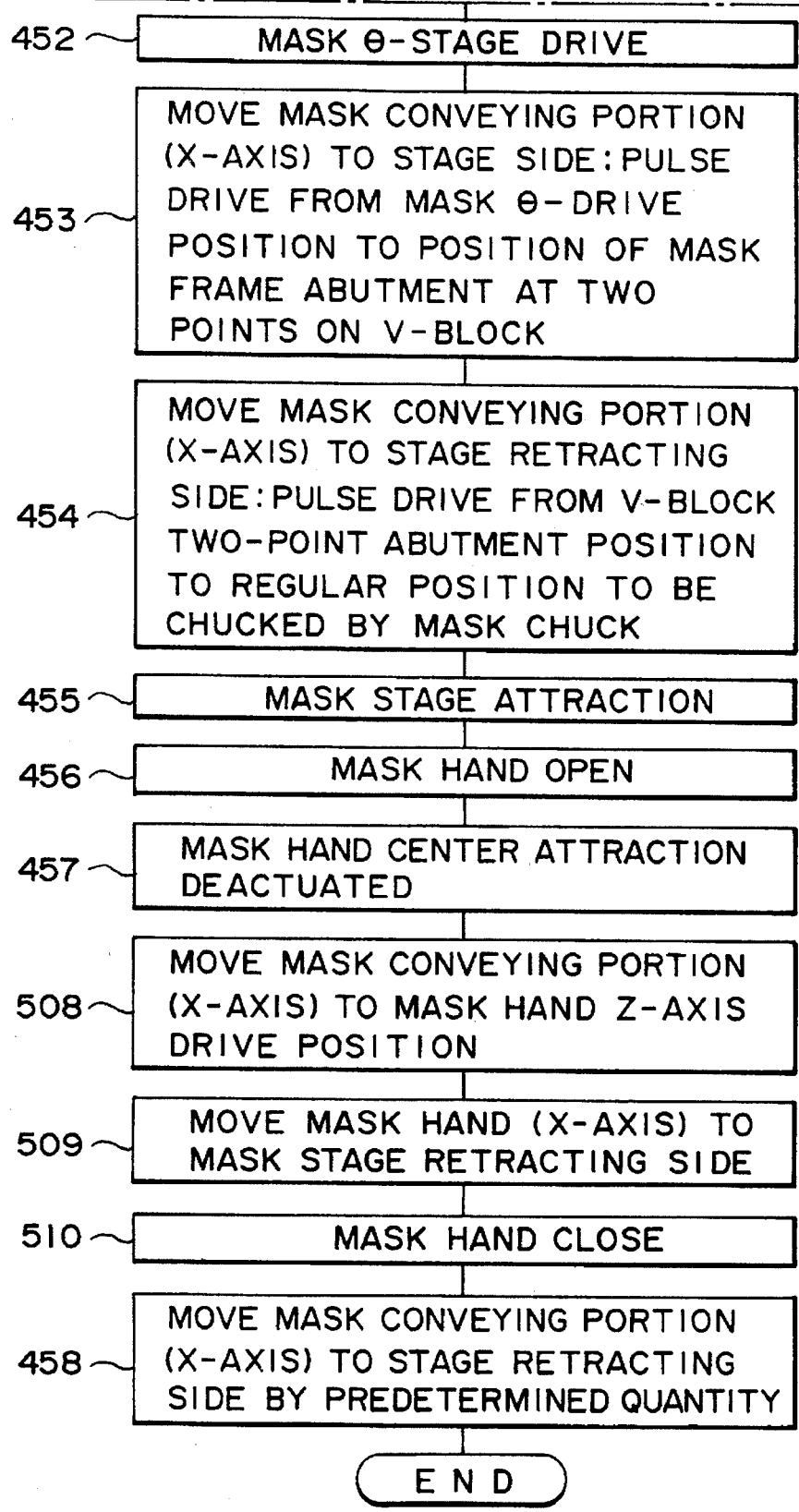

In the flow chart of FIG. 19, when the operation of the mask transfer mechanism starts, first, the conveying portion (arm unit) 308 is moved in the X-axis direction by rotation of the motor 334 to the driving position for the mask hand 313 (FIG. 10) (step 500). After this, the Z-axis drive motor 362 (FIG. 17) is actuated to move the mask hand 313 in the Z-axis direction, so as to press the mask 314 against the mask stage 317 (FIG. 10) (step 501).

In this state, the mask attracting magnet 324 of the mask stage 317 is rendered into a non-attracting state (step 502) and, thereafter, the motor 334 is driven to move the conveying portion 308 in the X-axis direction to the mask re-gripping position (step 503). In response to completion of this movement, the mask attracting magnet 324 is rendered into an attracting state, whereby the mask 314 is attracted to and held by the mask stage 317 (step 504). Subsequently, the solenoids 333 and 333' of the mask hand 313 are energized to open the fingers 21 (FIG. 3) to release the holding of the mask 314 (step 505) and then to close the fingers 21 to re-hold the mask 314 (step 506).

Thereafter, the magnet 324 of the mask stage 317 is rendered again into a non-attracting state (step 507) and, after this, the motor 334 is rotated to move the conveying portion 308 in the X-axis direction, to thereby move the mask hand 313 to a designated position at the mask stage 317 side, for the mask holding (step 438).

Figure 6:
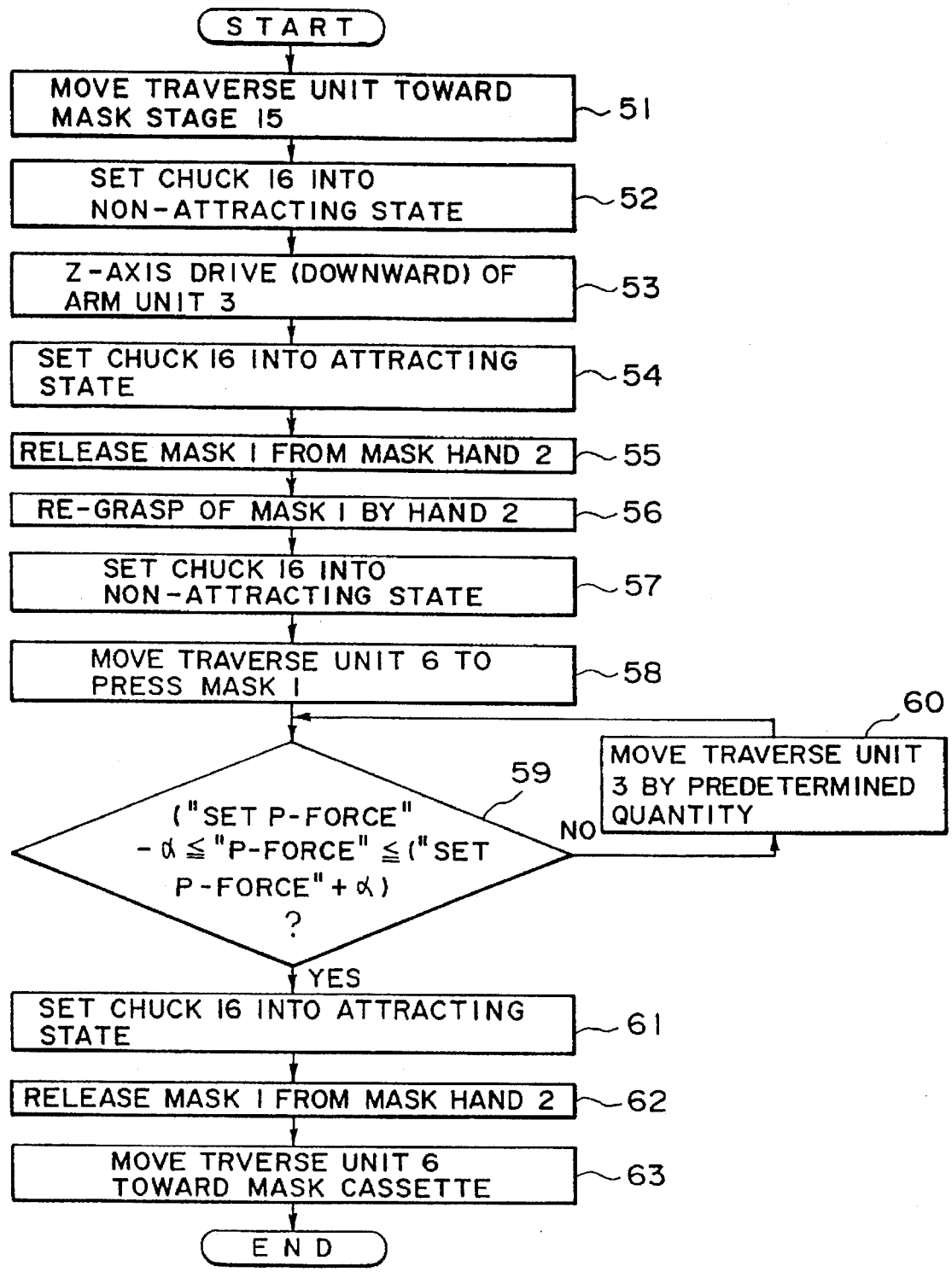
FIG. 6 is a flow chart, for explaining an example of operation of the mask conveying device of FIG. 2.

The above-described operation is similar to the operation made at steps 51–58 in the flow chart of FIG. 6, and this is done for correcting any inclination of the mask 314 with respect to the mask stage 317.

The operation to be made at steps 439–447 corresponds to the operation of those steps in the flow chart of FIG. 15 as denoted by corresponding reference numerals and, therefore, duplicate explanation is omitted here. After the mask 314 is held in a predetermined state by the mask stage 317 and, at step 447, the center attracting means 315 is rendered into a non-attracting state, the conveying portion 308 is moved again along the X-axis direction to the driving position for the mask hand 313 (step 508). After this, the mask hand 313 is moved in the X-axis direction, away from the mask stage 317 (step 509). Then, the mask hand 313 is closed (step 510) and, after this, the conveying portion 308 is moved in the X-axis direction while the mask hand 313 is moved away from the mask stage 317 (step 448).

The operation of the mask transfer mechanism in the flow chart of FIG. 20 is such that: The operation to be made at steps 500–507 and the operation to be made at steps 508–510 correspond to those to be made at the steps in FIG. 19 as depicted by corresponding reference numerals. Also, the operation to be made at steps 450–467 and the operation to be made at step 458 correspond to those in the steps of FIG. 16 as depicted by corresponding reference numerals. Thus, duplicate explanation thereof is omitted here.

While the invention has been described with reference to the structures disclosed herein, it is not confined to the details set forth and this application is intended to cover such modifications or changes as may come within the purposes of the improvements or the scope of the following claims.

What is claimed is:

1. A positioning method in a conveying device comprising a chuck and a hand for gripping a substrate, said method comprising:

a first attracting step for attracting and holding the substrate through the chuck, as the substrate is conveyed onto the chuck;

a releasing step for releasing the attraction of the chuck, after the substrate attracted to and held by the chuck in said first attracting step is gripped by the hand;

a positioning step for driving the conveying device to press the substrate, gripped by the hand in said releasing step, against reference means and for detecting the pressing force applied to the hand through the substrate, and stopping the driving of the conveying device when the detected pressing force reaches a predetermined set pressing force; and a second attracting step for attracting and holding the substrate through the chuck after the conveying device is stopped in said positioning step.

2. A method according to claim 1, wherein the hand grips the substrate such that the substrate is substantially upright, and wherein the chuck attracts and hold the substrate such that the substrate is substantially upright.

3. A method according to claim 1, further comprising using a strain gauge to detect the pressing force applied to the hand through the substrate.

4. A method according to claim 1, further comprising using a piezoelectric type pressure transducer to detect the pressing force applied to the hand through the substrate.

5. A method of positioning a substrate having a substantially circular outer peripheral shape, by using a hand for holding the substrate, said method comprising the steps of:

pressing the substrate against reference means with a first pressing force;

urging the substrate in a direction away from the reference means so as to provide a second pressing force, smaller than the first pressing force, for the pressing of the substrate against the reference means;

rotating the substrate with the second pressing force applied thereto;

pressing the substrate against the reference means again with the first pressing force;

urging the substrate in a direction away from the reference means so as to provide a third pressing force, smaller than the first pressing force, for the pressing of the substrate against the reference means; and fixedly holding the substrate with the third pressing force applied thereto.

6. A method according to claim 5, further comprising providing a sensor on the hand to detect each of the first through third pressing forces, for feedback control.

7. A method according to claim 5, further comprising controlling each of the first through third pressing forces in accordance with a driving quantity of a conveying actuator, for the hand.

8. A conveying and positioning device, comprising:

a chuck for vertically attracting a mask having a round shape, said chuck including a positioning reference member with two surfaces;

a hand member for holding the mask;

conveying means for conveying said hand member in a direction toward the reference member;

detecting means for detecting a respective force applied to said hand member through the mask, in response to abutment of the mask against the two surfaces of the positioning reference member; and control means for controlling said conveying means on the basis of the detection by said detecting means, so as to press the mask against the two surfaces with a first force and then with a second force, less than the first force, before the mask is attracted by the chuck.

9. A device according to claim 8, wherein said detecting means comprises a strain gauge.

10. A device according to claim 8, wherein said detecting means comprises a piezoelectric type pressure transducer.

11. A device according to claim 8, wherein said control means comprises means for stopping said conveying means when the detected force exceeds a predetermined value.

* * * * *

UNITED STATES PATENT AND TRADEMARK OFFICE
CERTIFICATE OF CORRECTION

PATENT NO. : 5,641,264　　　　　　　Page 1 of 2
DATED : June 24, 1997
INVENTOR(S) : MITSUTOSHI KUNO, ET AL.

It is certified that error appears in the above-identified patent and that said Letters Patent is hereby corrected as shown below:

COLUMN 3:

Line 41, "0" should read --$\theta$--.

COLUMN 4:

Line 56, "as" should read --a--.

COLUMN 12:

Line 11, "332,335,336" should read --332, 335, 336--.

COLUMN 13:

Line 6, "the" should read --be--.

UNITED STATES PATENT AND TRADEMARK OFFICE
CERTIFICATE OF CORRECTION

PATENT NO. :  5,641,264

DATED      :  June 24, 1997

INVENTOR(S) :
              MITSUTOSHI KUNO, ET AL.

It is certified that error appears in the above-identified patent and that said Letters Patent is hereby corrected as shown below:

<u>COLUMN 16</u>,

Line 63, "hold" should read --holds--.

Signed and Sealed this

Thirteenth Day of January, 1998

Attest:

BRUCE LEHMAN

Attesting Officer          Commissioner of Patents and Trademarks